(12) United States Patent
Choi et al.

(10) Patent No.: US 8,508,251 B2
(45) Date of Patent: Aug. 13, 2013

(54) SEMICONDUCTOR DEVICES HAVING ON-DIE TERMINATION STRUCTURES FOR REDUCING CURRENT CONSUMPTION AND TERMINATION METHODS PERFORMED IN THE SEMICONDUCTOR DEVICES

(75) Inventors: Jung-hwan Choi, Hwaseong-si (KR); Yang-ki Kim, Seoul (KR); Young Choi, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 120 days.

(21) Appl. No.: 12/662,511

(22) Filed: Apr. 21, 2010

(65) Prior Publication Data

US 2011/0109344 A1    May 12, 2011

(30) Foreign Application Priority Data

Nov. 11, 2009    (KR) .................. 10-2009-0108661

(51) Int. Cl.
*H03K 19/003*    (2006.01)
(52) U.S. Cl.
USPC ............................................. 326/30
(58) Field of Classification Search
USPC ................... 326/30–34, 86, 87
See application file for complete search history.

(56) References Cited

U.S. PATENT DOCUMENTS

| | | | | |
|---|---|---|---|---|
| 7,135,884 B1* | 11/2006 | Talbot et al. | ......... | 326/30 |
| 7,528,626 B2* | 5/2009 | Kim | ......... | 326/30 |
| 7,692,446 B2* | 4/2010 | Lee et al. | ......... | 326/30 |
| 2003/0218477 A1* | 11/2003 | Jang et al. | ......... | 326/30 |
| 2007/0216441 A1 | 9/2007 | Nemoto et al. | | |
| 2008/0048714 A1* | 2/2008 | Lee et al. | ......... | 326/30 |
| 2008/0074138 A1* | 3/2008 | Lee | ......... | 326/30 |
| 2008/0284467 A1* | 11/2008 | Koo | ......... | 326/30 |
| 2009/0002018 A1* | 1/2009 | Jeong et al. | ......... | 326/30 |

FOREIGN PATENT DOCUMENTS

| | | |
|---|---|---|
| KR | 10-0866928 | 11/2008 |
| KR | 10-2009-0061278 | 6/2009 |

* cited by examiner

*Primary Examiner* — Crystal L Hammond
(74) *Attorney, Agent, or Firm* — Harness, Dickey & Pierce, P.L.C.

(57) ABSTRACT

Example embodiments disclose a semiconductor device having an on-die termination (ODT) structure that reduces current consumption, and a termination method performed in the semiconductor device. The semiconductor device includes a calibration circuit for generating calibration codes in response to a reference voltage and a voltage of a calibration terminal connected to an external resistor and an on-die termination device for controlling a termination resistance of a data input/output pad in response to the calibration codes and an on-die termination control signal. The termination resistance of the data input/output pad is greater than a resistance of the calibration terminal.

18 Claims, 21 Drawing Sheets

SEMICONDUCTOR DEVICES HAVING ON-DIE TERMINATION STRUCTURES FOR REDUCING CURRENT CONSUMPTION AND TERMINATION METHODS PERFORMED IN THE SEMICONDUCTOR DEVICES

CROSS-REFERENCE TO RELATED APPLICATIONS

This nonprovisional U.S. application claims priority under 35 U.S.C. §119 to Korean Patent Application No. 10-2009-0108661, filed on Nov. 11, 2009, in the Korean Intellectual Property Office, the entire contents of which are herein incorporated by reference.

BACKGROUND

Inventive concepts relate to semiconductor devices, and more particularly, to semiconductor devices having an on-die termination (ODT) structure that reduces current consumption, and termination methods performed in the semiconductor devices.

Semiconductor devices include an input circuit for receiving signals from an external circuit via an input pad, and an output circuit for providing internal signals to the external circuit. As the operational speeds of digital products increase, swing widths of signals interfaced between semiconductor devices decrease. A reason for the decrease of the swing widths is to minimize the time taken to transmit the signals. However, as the swing widths decrease, the semiconductor devices are affected by external noise, and a reflection signal generated by impedance mismatch affects an interface between semiconductor devices. When impedance mismatch occurs, high-speed data transmission is difficult to achieve, and data output from an output terminal of a semiconductor device may be distorted. In this case, a semiconductor device on a reception side may receive a distorted output signal and cause problems such as setup/hold failure and miss-judgment. To address these problems, semiconductor devices required to operate fast include an impedance matching circuit installed near a pad within an integrated circuit chip.

SUMMARY

Inventive concepts provide a semiconductor device including an on-die termination device for reducing current consumption.

Inventive concepts also provide a memory module including the semiconductor device.

Inventive concepts also provide a system including the semiconductor device.

Inventive concepts also provide a termination method performed in the semiconductor device.

According to an aspect of inventive concepts, there is provided a semiconductor device including a calibration circuit for generating calibration codes in response to a reference voltage and a voltage of a calibration terminal connected to an external resistor, and an on-die termination device for controlling a termination resistance of a data input/output pad in response to the calibration codes and an on-die termination control signal. The termination resistance of the data input/output pad is greater than a resistance of the calibration terminal.

According to example embodiments of inventive concepts, the on-die termination control signal may be set according to an intention of a user of the semiconductor device.

According to example embodiments of inventive concepts, the on-die termination control signal may be generated by combining an on-die termination signal received from the outside of the semiconductor device, on-die termination control address signals set in a mode register, and an on-die termination current reduction signal set according to a user's intention.

According to example embodiments of inventive concepts, the on-die termination current reduction signal may be set in the mode register of the semiconductor device, or the on-die termination current reduction signal may be set using a fuse cutting method.

According to example embodiments of inventive concepts, the termination resistance of the data input/output pad may be controlled by reducing the number of gate fingers included in a transistor of the on-die termination device or by increasing the thickness of a gate of the transistor. Alternatively, the termination resistance of the data input/output pad may be controlled by increasing the resistance of the on-die termination device.

According to example embodiments of inventive concepts, the on-die termination device may include a control unit for controlling the number of on-die termination units turned on in response to the on-die termination control signal, and a plurality of the on-die termination units connected to the data input/output pad and having a resistance corresponding to N times a resistance of the external resistor. N denotes a natural number equal to or greater than 1.

According to example embodiments of inventive concepts, the on-die termination unit may include a pull-up resistance unit for terminating the data input/output pad having a resistance corresponding to twice the resistance of the external resistor in response to a pull-up calibration code, and a pull-down resistance unit for terminating the data input/output pad to having a resistance corresponding to twice the resistance of the external resistor in response to a pull-down calibration code.

According to example embodiments of inventive concepts, the on-die termination device may include a control unit for controlling the number of first and second on-die termination units turned on in response to the on-die termination control signal, at least N first on-die termination units connected to the data input/output pad and having a resistance corresponding to N times a resistance of the external resistor, wherein N denotes a natural number equal to or greater than 1, and a plurality of the second on-die termination units connected to the data input/output pad and having a resistance corresponding to half the resistance of the external resistor.

According to example embodiments of inventive concepts, the first on-die termination unit may include a pull-up resistance unit for terminating the data input/output pad having a resistance corresponding to 2N times the resistance of the external resistor in response to the pull-up calibration code, and a pull-down resistance unit for terminating the data input/output pad having a resistance corresponding to 2N times the resistance of the external resistor in response to the pull-down calibration code.

According to example embodiments of inventive concepts, the second on-die termination unit may include a pull-up resistance unit for terminating the data input/output pad having the resistance of the external resistor in response to the pull-up calibration code, and a pull-down resistance unit for terminating the data input/output pad having the resistance of the external resistor in response to the pull-down calibration code.

According to example embodiments of inventive concepts, the calibration circuit may include a first comparison unit for comparing a voltage of the calibration terminal with the reference voltage to output the pull-up calibration code, the first pull-up resistance unit connected to the calibration terminal and controlling a resistance of the first pull-up resistance unit to be equal to the resistance of the external resistor in response to the pull-up calibration code, the second pull-up resistance unit connected to a first node and controlling a resistance of the second pull-up resistance unit to be equal to the resistance of the first pull-up resistance unit in response to the pull-up calibration code, a second comparison unit for comparing a voltage of the first node with the reference voltage to output the pull-down calibration code, and the pull-down resistance unit connected to the first node and controlling a resistance of the pull-down resistance unit to be equal to the resistance of the second pull-up resistance unit in response to the pull-down calibration code.

According to example embodiments of inventive concepts, each of the first and second pull-up resistance units and the pull-down resistance unit has a structure in which N resistors, each of the N resistors having a resistance N times greater than the resistance of the external resistor, are connected to each other in parallel.

According to example embodiments of inventive concepts, the semiconductor device is a memory device selected from a group including random access memory (RAM), synchronous dynamic RAM (SDRAM), double data rate (DDR) SDRAM, direct RAMBUS™ (RD) RAM, video RAM (VRAM), static RAM (SRAM), flash memory, erasable programmable read only memory (EPROM), electrical EPROM (EEPROM), and phase change RAM (PRAM).

According to another aspect of inventive concepts, there is provided a memory module including a printed circuit board, at least one memory chip mounted on the printed circuit board and at least two stacked semiconductor devices. Each of the semiconductor devices includes a calibration circuit for generating pull-up calibration codes and pull-down calibration codes in response to a reference voltage and a voltage of a calibration terminal to which an external resistor is connected, and an on-die termination device for controlling a termination resistance of a data input/output pad in response to the pull-up calibration codes, the pull-down calibration codes, and an on-die termination control signal. The termination resistance of the data input/output pad is greater than a resistance of the calibration terminal.

According to another aspect of inventive concepts, there is provided a system including a semiconductor device, and a controller for controlling the semiconductor device via a bus. The semiconductor device includes a calibration circuit for generating a pull-up calibration code and a pull-down calibration code in response to a reference voltage and a voltage of a calibration terminal to which an external resistor is connected, and an on-die termination device for controlling a termination resistance of a data input/output pad in response to the pull-up calibration code, the pull-down calibration code, and an on-die termination control signal. The termination resistance of the data input/output pad is greater than a resistance of the calibration terminal.

According to another aspect of inventive concepts, there is provided a termination method performed in a semiconductor device, including terminating a data input/output pad to have a first termination resistance in response to a pull-up calibration code and a pull-down calibration code that are provided by a calibration operation on a calibration terminal, and terminating the data input/output pad to have a second termination resistance in response to the pull-up and pull-down calibration codes and an on-die termination control signal that is set according to a user's intention. The second termination resistance is greater than the first termination resistance.

According to example embodiments of inventive concepts, the calibration operation may include comparing a voltage of the calibration terminal with a reference voltage to output the pull-up calibration code, controlling a resistance of a first pull-up resistance unit connected to the calibration terminal to be equal to a resistance of an external resistor connected to the calibration terminal in response to the pull-up calibration code, controlling a resistance of a second pull-up resistance unit connected to a first node to be equal to the resistance of the first pull-up resistance unit in response to the pull-up calibration code, comparing a voltage of the first node with the reference voltage to output the pull-down calibration code, and controlling a resistance of a pull-down resistance unit connected to the first node to be equal to the resistance of the second pull-up resistance unit in response to the pull-down calibration code.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
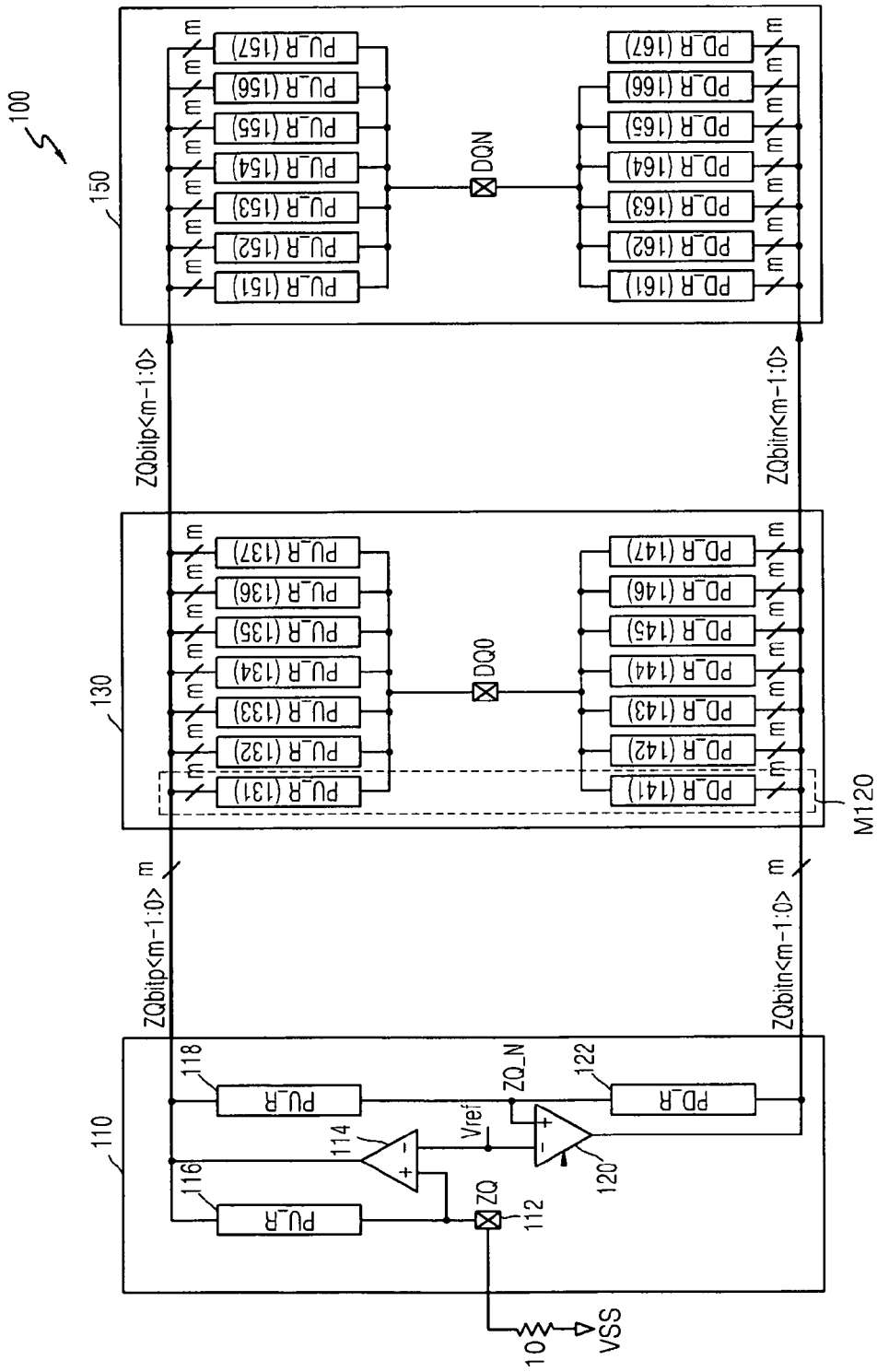
FIG. 1 is a block diagram of a semiconductor device according to an example embodiment.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this disclosure will be thorough and complete, and will fully convey the scope of inventive concepts to those skilled in the art. In the drawings, the sizes and relative sizes of elements may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In impedance matching between a transmission side and a reception side of a system, source termination is generally performed on the transmission side by an output circuit, and parallel termination is generally performed on the reception side by a termination circuit connected in parallel to an input circuit connected to an input pad. A process of providing pull-up and pull-down codes for terminations based on a Process-Voltage-Temperature (PVT) variation is related to ZQ calibration. The ZQ calibration denotes calibration performed using a ZQ node. As for semiconductor devices, a termination resistance of a data input/output pad (or a DQ pad) is controlled using codes generated by the ZQ calibration.

For example, a semiconductor device includes a ZQ pin as a ZQ calibration terminal and thus receives ZQ calibration commands ZQCS and ZQCL from an external source. When the external ZQ calibration commands ZQCS and ZQCL are input, ZQ calibration is performed within a duration prescribed in the external ZQ calibration commands ZQCS and ZQCL. Since an output circuit is not used during ZQ calibration, access to a chip is prohibited, and the next command is not input. The duration prescribed in the external ZQ calibration commands ZQCS and ZQCL is a ZQ calibration period, and ZQ calibration needs to be completed within the ZQ calibration period. The ZQ calibration is performed by matching ZQ calibration with an externally installed termination resistor.

Figure 2:
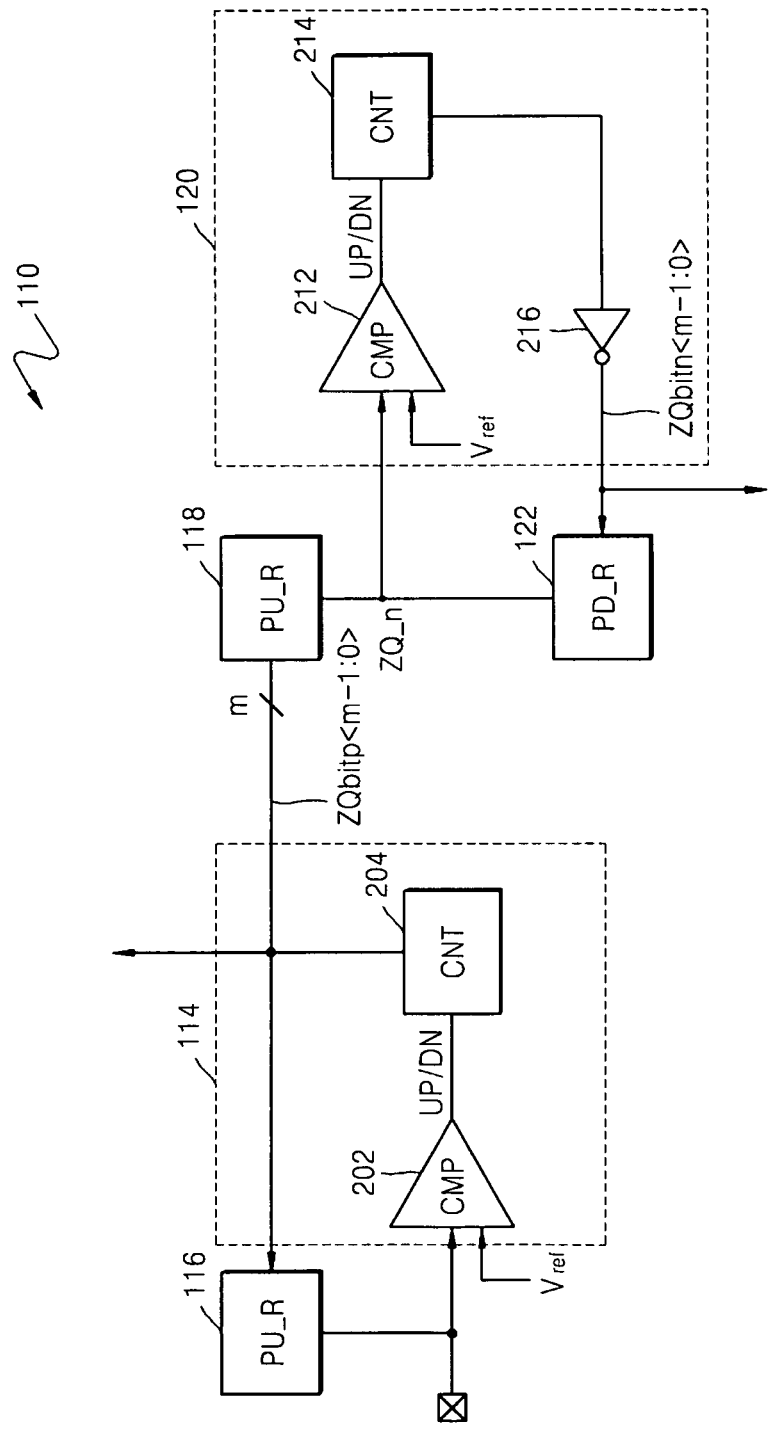
FIG. 2 illustrates a ZQ (zero-quotient) calibration circuit included in the semiconductor device illustrated in FIG. 1.
Figure 3:
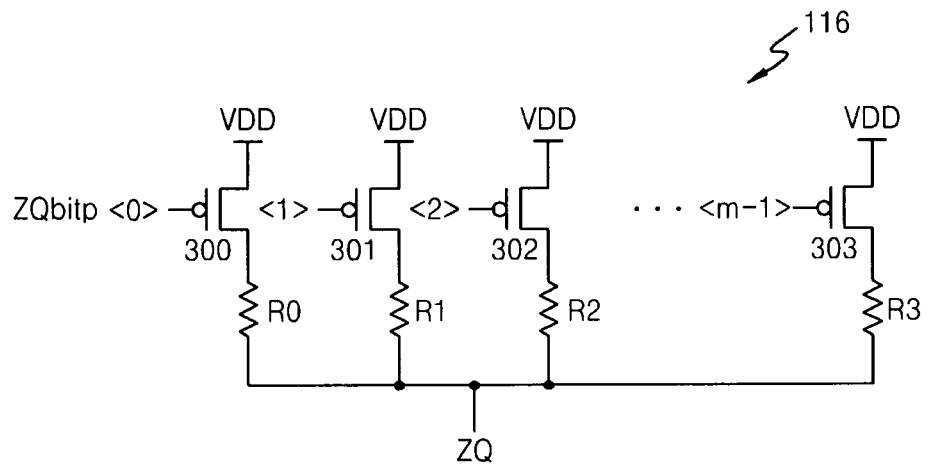
FIG. 3 is a circuit diagram of a pull-up resistance unit of the ZQ calibration circuit illustrated in FIG. 1.

FIG. 1 is a block diagram of a semiconductor device 100 according to an example embodiment. FIG. 2 illustrates a ZQ calibration circuit 110 included in the semiconductor device 100 illustrated in FIG. 1. FIG. 3 is a circuit diagram of a first pull-up resistance unit 116 of the ZQ calibration circuit 110 illustrated in FIG. 1. It should be understood that a second pull-up resistance unit 118 may have the same structure of the first pull-up resistance unit 116 illustrated in FIG. 3. Referring to FIG. 1, the semiconductor device 100 includes the ZQ calibration circuit 110 including a ZQ pin 112, and connected to on-die termination devices 130 and 150 each connected to data input/output pads DQ0-DQN where n is a natural number greater than or equal to 1.

The ZQ calibration circuit 110 includes the ZQ pin 112, a first comparison unit 114, a first pull-up resistance unit 116, a second pull-up resistance unit 118, a second comparison unit 120, and a pull-down resistance unit 122, and performs pull-up calibration and pull-down calibration.

The first comparison unit 114 compares a voltage of the ZQ pin 112 with a reference voltage Vref and outputs pull-up calibration codes ZQbitp<m-1:0>, where m is a positive integer. The reference voltage Vref may be set to have a voltage level corresponding to half a power supply voltage. For example, the reference voltage Vref may be generated by a reference voltage generation circuit (not shown) for outputting the reference voltage Vref from a connection point of two resistors that are serially connected between a power supply voltage and a ground voltage. The first comparison unit 114, as illustrated in FIG. 2, includes a comparator 202 for comparing the voltage of the ZQ pin 112 with the reference voltage Vref and outputting an up/down signal UP/DN, and a counter 204 for counting according to the up/down signal UP/DN to generate the pull-up calibration codes ZQbitp<m-1:0>.

In FIG. 1, the first pull-up resistance unit 116 is connected to the ZQ pin 112. The first pull-up resistance unit 116, as illustrated in FIG. 3, includes PMOS transistors 300-303 having gates to which the pull-up calibration codes ZQbitp<m-1:0> are respectively input, and resistors R0-R3 serially connected to the PMOS transistor 300-303, respectively, between a power supply voltage VDD and the ZQ pin 112. The first pull-up resistance unit 116 controls its own impedance in response to the pull-up calibration codes ZQbitp<m-1:0>. The first comparison unit 114 and the first pull-up resistance unit 116 compare the voltage of the ZQ pin 112 with the reference voltage Vref until they are equal to each other, and generate the pull-up calibration codes ZQbitp<m-1:0>. A repetitive operation for generating the pull-up calibration codes ZQbitp<m-1:0> is a pull-up calibration. For example, an external resistor 10 of 240Ω may be connected to the ZQ pin 112. Since the reference voltage Vref has a voltage level corresponding to half the power supply voltage VDD, the first comparison unit 114 generates the pull-up calibration codes ZQbitp<m-1:0> so that a resistance of the first pull-up resistance unit 116 becomes equal to the resistance of 240Ω of the external resistor 10.

The second pull-up resistance unit 118 is connected to a first node ZQ_N and controls its impedance in response to the pull-up calibration codes ZQbitp<m-1:0>. The second pull-up resistance unit 118 is constructed equally as the first pull-up resistance unit 116 of FIG. 2, and thus includes PMOS transistors having gates to which the pull-up calibration codes ZQbitp<m-1:0> are respectively input, and resistors serially connected to the PMOS transistors, respectively, between the power supply voltage VDD and the first node ZQ_N. The second pull-up resistance unit 118 has the same resistance as the first pull-up resistance unit 116, for example, has a resistance of 240Ω.

The second comparison unit 120 compares a voltage of the first node ZQ_N with the reference voltage Vref and outputs pull-down calibration codes ZQbitn<m-1:0>. As illustrated in FIG. 2, the second comparison unit 120 includes a comparator 212 for comparing the voltage of the first node ZQ_N with the reference voltage Vref and outputting an up/down signal UP/DN, a counter 214 for counting according to the up/down signal UP/DN, and an inverter 216 for receiving an output of the counter 214 and generating the pull-down calibration codes ZQbitn<m-1:0>.

Figure 4:
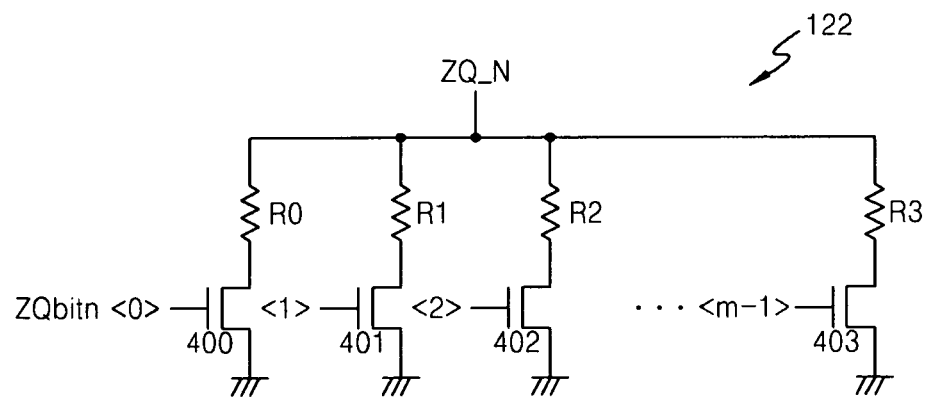
FIG. 4 is a circuit diagram of a pull-down resistance unit of the ZQ calibration circuit illustrated in FIG. 1.

The pull-down resistance unit 122 is connected to the first node ZQ_N and controls the impedance of the second pull-down resistance unit 118 in response to the pull-down calibration codes ZQbitn<m-1:0>. FIG. 4 is a circuit diagram of the pull-down resistance unit 122 of the ZQ calibration circuit 110 illustrated in FIG. 1. As illustrated in FIG. 4, the pull-down resistance unit 122 includes NMOS transistors 400-403 having gates to which the pull-down calibration codes ZQbitn<m-1:0> are respectively input, and resistors R0-R3 serially connected to the NMOS transistors 400-403, respectively, between the first node ZQ_N and a ground voltage VSS. The second comparison unit 120 and the pull-down resistance unit 122 compares the voltage of the first node ZQ_N with the reference voltage Vref and generates the pull-down calibration codes ZQbitn<m-1:0> so that the pull-down resistance unit 122 has the same resistance as the second pull-up resistance unit 118, for example, a resistance of 240Ω. A repetitive operation for generating the pull-down calibration codes ZQbitn<m-1:0> is a pull-down calibration.

Figure 5:
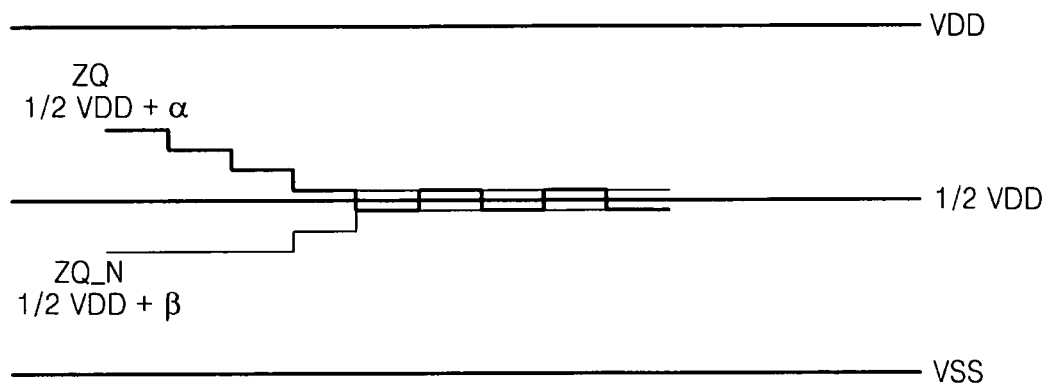
FIG. 5 illustrates variations of voltages of a ZQ pin and a first node according to results of pull-up and pull-down calibration operations.

FIG. 5 illustrates variations of the voltages of the ZQ pin 112 and the first node ZQ_N according to pull-up and pull-down calibration operations. Referring to FIG. 5, as time lapses, the voltages of the ZQ pin 112 and the first node ZQ_N converge to ½ VDD from ½ VDD+α and ½ VDD+β, respectively, where α and β are variables.

Referring back to FIG. 1, the pull-up calibration codes ZQbitp<m-1:0> and the pull-down calibration codes ZQbitn<m-1:0> generated through the pull-up and pull-down calibrations, respectively, determine the resistances of the on-die termination devices 130 and 150 of the data input/output pads DQ0-DQN. The on-die termination devices 130 and 150 of the data input/output pads DQ0-DQN include a plurality of pull-up resistance units 131-137 and a plurality of pull-up resistance units 151-157, respectively, and a plurality of pull-down resistance units 141-147 and a plurality of pull-down resistance units 161-167, respectively.

It should be understood that the data input/output pads DQ0-DQN have the same structure. For convenience of explanation, the data input/output pad DQ0 will now be explained. Each of the pull-up resistance units 131-137 within the on-die termination device 130 of the data input/output pad DQ0 may have the same structure (schematically) as that of the first and second pull-up resistance units 116 or 118 of the ZQ calibration circuit 110, and each of the pull-down resistance units 141-147 within the on-die termination device 130 of the data input/output pad DQ0 may have the same structure (schematically) as that of the pull-down resistance unit 122 of the ZQ calibration circuit 110. Accordingly, a resistance of the pull-up resistance unit 131 is 240Ω in response to the pull-up calibration codes ZQbitp<m-1:0>, and a resistance of the pull-down resistance unit 141 is 240Ω in response to the pull-down calibration codes ZQbitn<m-1:0>. Thus, an effective resistance of the on-die termination device 130 including a pair of the pull-up resistance unit 131 and the pull-down resistance unit 141 is 120Ω. When the pair of the pull-up resistance unit 131 and the pull-down resistance unit 141 of the on-die termination device 130 is referred to as an on-die termination unit M120 having an effective resistance of 120Ω, the data input/output pad DQ0 is connected to 7 on-die termination units M120 each having an effective resistance of 120Ω, as illustrated in FIG. 6.

Figure 6:
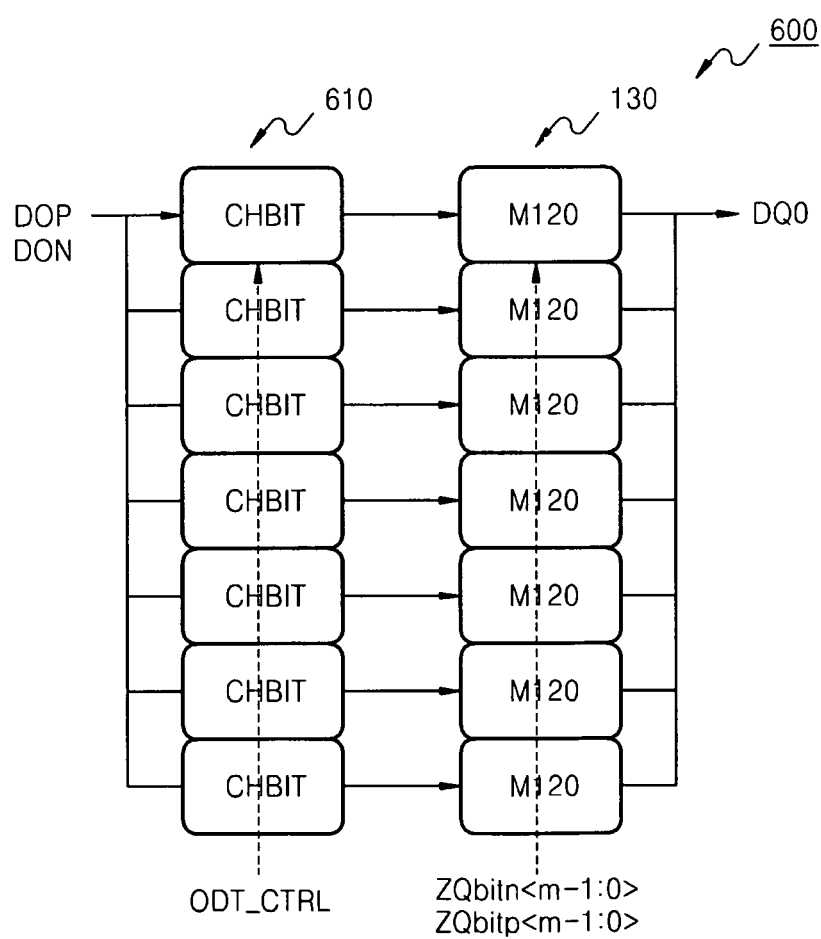
FIG. 6 illustrates an output driver connected to a data input/output pad of the semiconductor device illustrated in FIG. 1.

FIG. 6 illustrates an output driver 600 connected to the data input/output pad DQ0. Referring to FIG. 6, the output driver 600 includes a control unit 610 for determining whether to use each of the 7 on-die termination units M120 in response to control signals DOP, DON, and ODT_CTRL, and the on-die termination device 130 connected to the data input/output pad DQ0.

According to the number of bits enabled in the control unit 610, the number of on-die termination units M120, to be turned on is determined. If only one bit is enabled in the control unit 610, one on-die termination unit M120 having an effective resistance of 120Ω is turned on. Accordingly, the resistance of the on-die termination device 130 of the data input/output pad DQ0 is 120Ω. If two bits are enabled in the control unit 610, two on-die termination units M120 each having an effective resistance of 120Ω are turned on and thus form a parallel connection structure. Thus, the resistance of the on-die termination device 130 of the data input/output pad DQ0 is 60Ω. If three bits are enabled in the control unit 610, the resistance of the on-die termination device 130 of the data input/output pad DQ0 is 30Ω. If six bits are enabled in the control unit 610, the resistance of the on-die termination device 130 of the data input/output pad DQ0 is 20Ω.

In other words, the output driver 600 may selectively turn on the on-die termination units M120 which are operated by the pull-up calibration codes ZQbitp<m-1:0> and the pull-down calibration codes ZQbitn<m-1:0> generated by the ZQ calibration circuit 110, and thus may set a termination resistance differently depending on the type of system to which a semiconductor device is applied. The termination resistance of the data input/output pad DQ0 may be 120Ω, 60Ω, 40Ω, 30Ω, or 20Ω. The above-described method of setting the termination resistance of the data input/output pad DQ0 is also applied to the other data input/output pads, and thus the termination resistances of the data input/output pads DQ0-DQN may be 120Ω, 60Ω, 40Ω, 30Ω, or 20Ω. This may be an on-die termination (ODT) of a DDR3 SDRAM. To reduce current consumption in an operation of the semiconductor device 100 of FIG. 1, the ODT is set to have a resistance higher than the maximum termination resistance of 120Ω of the data input/output pads DQ0-DQN.

An input buffer (not shown) together with the output driver 600 is connected to the data input/output pads DQ0-DQN. When data is input to the data input/output pads DQ0-DQN, a size of the output driver 600 serves as an input capacitance of the data input/output pads DQ0-DQN. The input capacitance has an adverse influence on the signaling characteristics of the data input to the data input/output pads DQ0-DQN. As the size of the output driver 600 decreases due to the development of a semiconductor manufacturing process, the input capacitance of the data input/output pads DQ0-DQN also decreases. Accordingly, the signaling characteristics improve, and thus the termination resistance of the data input/output pads DQ0-DQN may be increased.

Figure 7A:
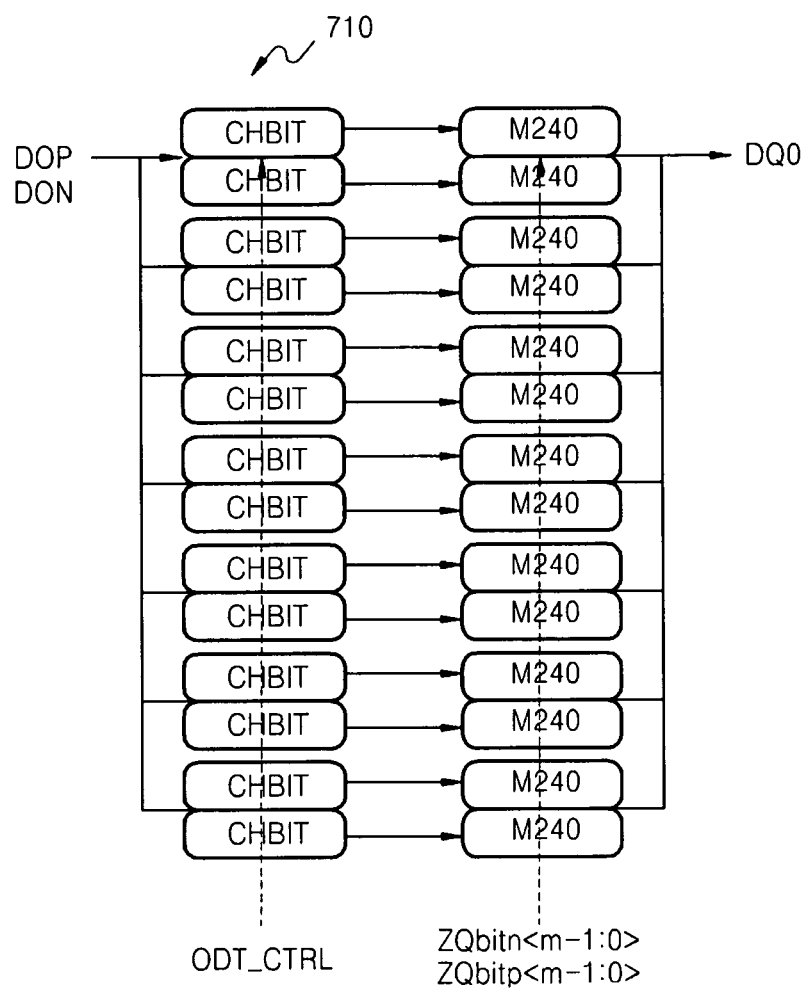
FIG. 7A illustrates a data input/output pad having an on-die termination (ODT) structure, according to an example embodiment of inventive concepts.

FIG. 7A illustrates an output driver having an ODT structure, according to an example embodiment of inventive concepts. Referring to FIG. 7A, a plurality of on-die termination units M240 each having an effective resistance of 240Ω are connected to the data input/output pad DQ0, and a control unit 710 for determining whether to use each of the on-die termination units M240 in response to the control signals DOP and DON (hereinafter, referred to as the read-out control signals DOP and DON) and the control signal ODT_CTRL (hereinafter, referred to as the ODT control signal ODT_CTRL) is connected to the on-die termination units M240. Each of the on-die termination units M240 having an effective resistance of 240Ω may be implemented by doubling the resistance of the first pull-up resistance unit 116 of FIG. 3 and the resistance of the pull-down resistance unit 122 of FIG. 4. FIGS. 7B through 7E illustrate examples of changing the resistances of the PMOS transistor 300 (hereinafter, referred to as a first PMOS transistor 300) and the resistor R0 (hereinafter, referred to as a first resistor R0) from among the PMOS transistors 300-303 and the resistors R0-R3 of the first pull-up resistance unit 116 or the second pull-up resistance unit 118 of FIG. 3.

Figure 7B:
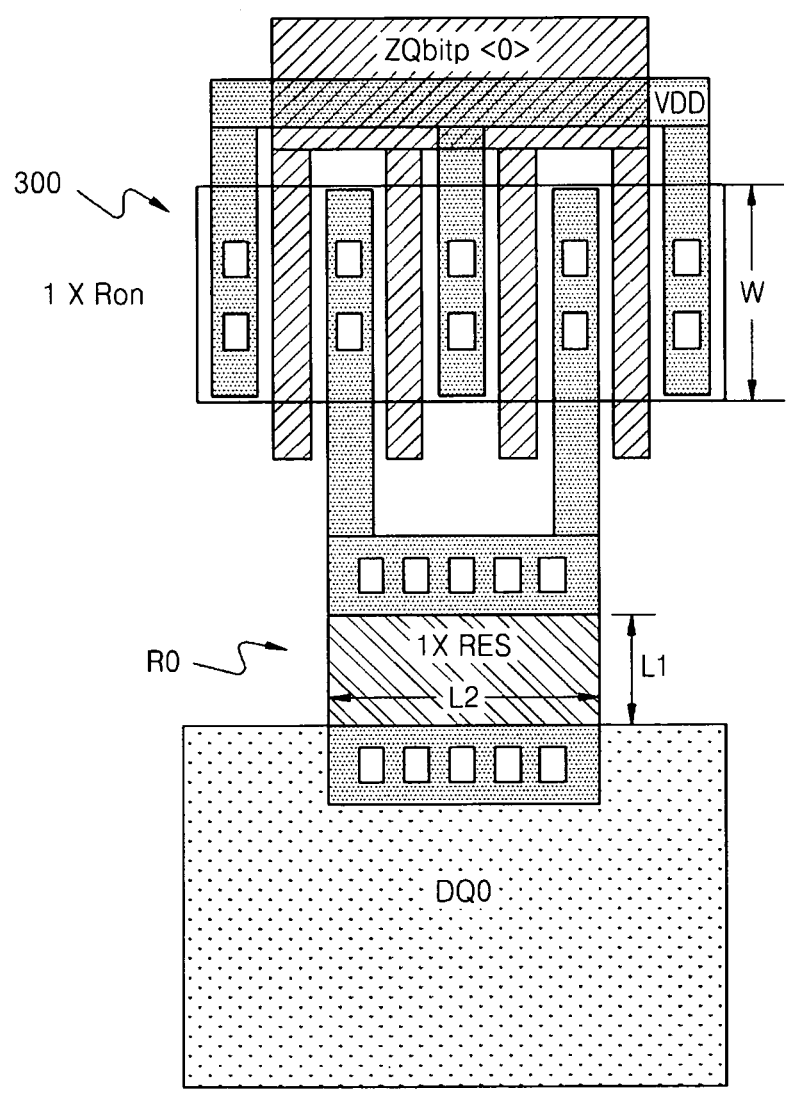
FIGS. 7B through 7E illustrate examples of changing the resistances of a PMOS transistor and a resistor of the pull-up resistance unit of FIG. 3.

FIG. 7B illustrates a layout in which the first PMOS transistor 300 connected to a first pull-up calibration code ZQbitp<0> includes four gate fingers each having a width W and has an on-resistance Ron, namely, 1×Ron, and the first resistor R0 has a length L1 and a width L2 and a resistance RES, namely, 1×RES.

Figure 7C:
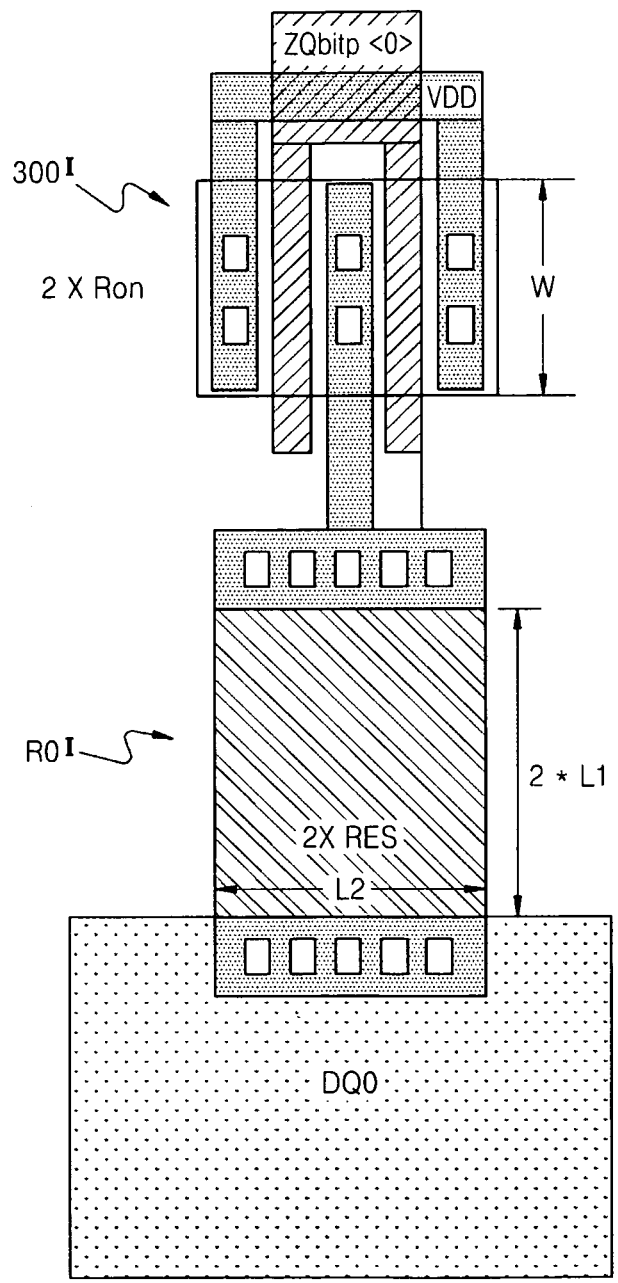
Figure 7D:
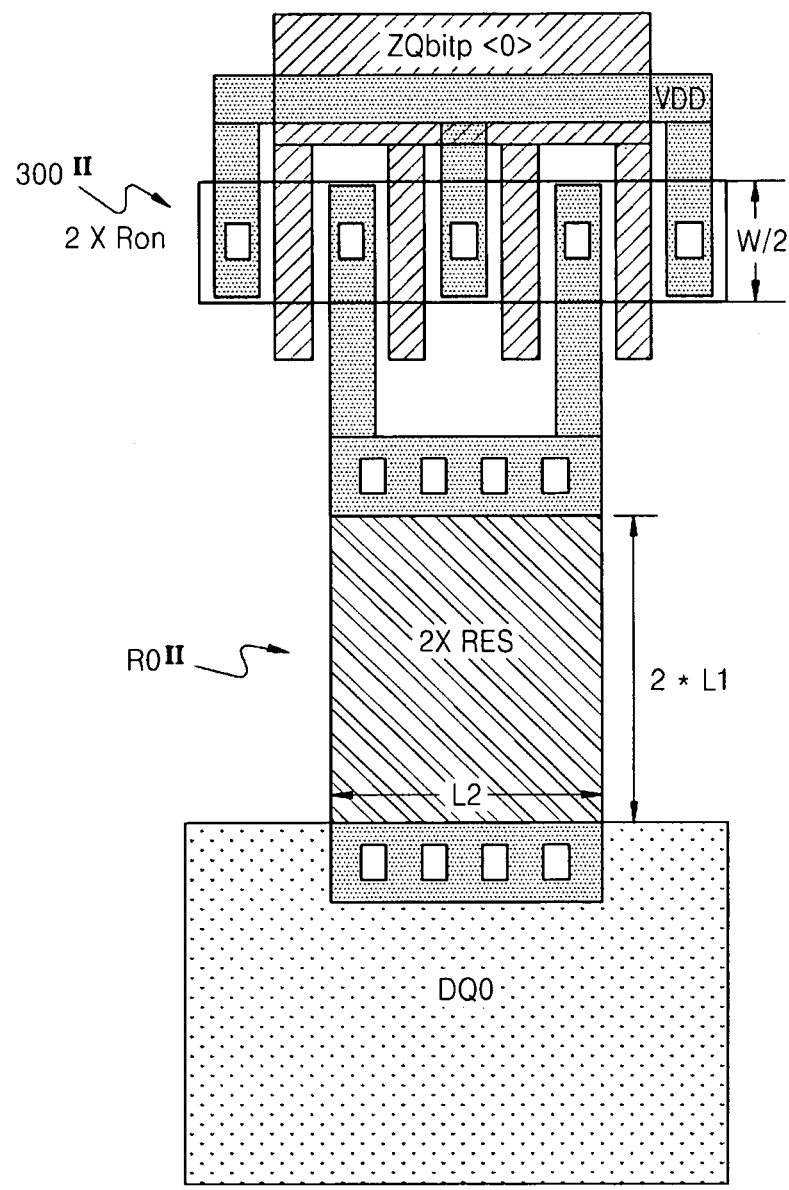
Figure 7E:
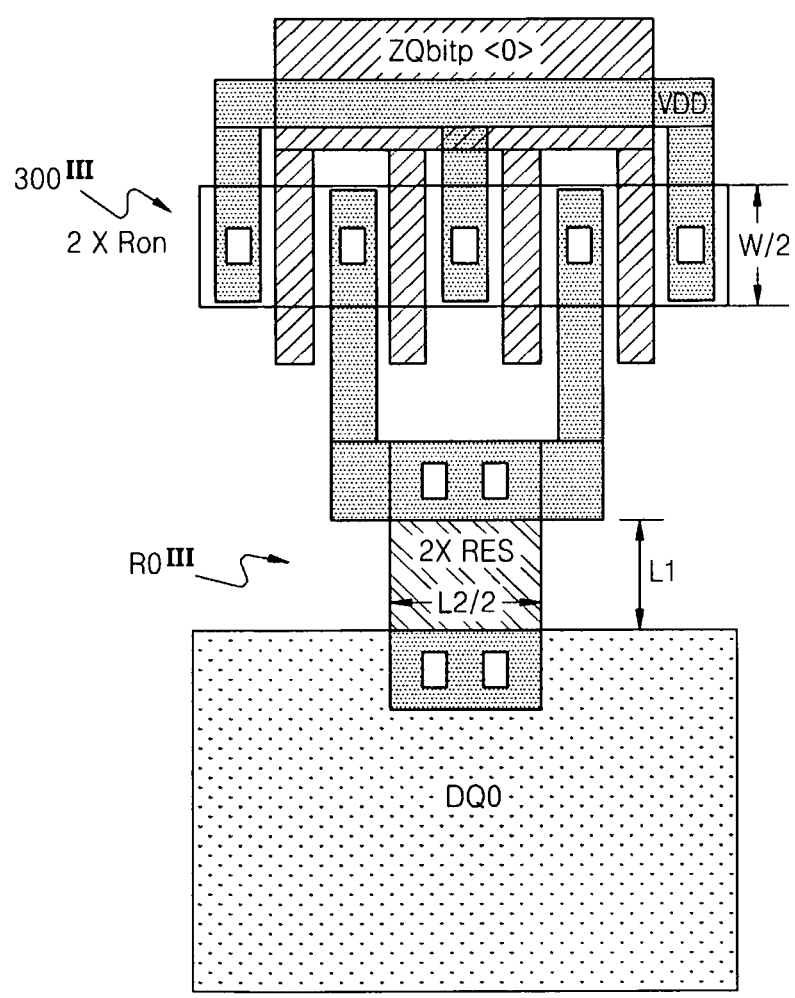

FIGS. 7C-7E and 9B-9D illustrate other example embodiments of the PMOS transistor. Compared with FIG. 7B, FIG. 7C illustrates a layout in which a first PMOS transistor 300' connected to the first pull-up calibration code ZQbitp<0> includes a reduced number of gate fingers, namely, 2 gate fingers each having the width W, and has an on-resistance, namely, 2×Ron, and a first resistor R0' has an increased length 2×L1 and the width L2 to have a resistance, namely, 2×RES. Compared with FIG. 7B, FIG. 7D illustrates a layout in which a first PMOS transistor 300" connected to the first pull-up calibration code ZQbitp<0> includes four gate fingers each having a halved width W/2 and was an on-resistance 2×Ron, and a first resistor R0 has an increased length 2×L1 and the width L2 to have the resistance 2×RES. Compared with FIG. 7B, FIG. 7E illustrates a layout in which a first PMOS transistor 300''' connected to the first pull-up calibration code ZQbitp<0> includes the four gate fingers each having the halved width W/2 and has an on-resistance 2×Ron, and a first resistor R0''' has a reduced width L2/2 to have the resistance 2×RES. As illustrated FIGS. 7C through 7E, the layouts allowing the first PMOS transistor and the first resistor to have high resistances occupy a smaller area than the layout of FIG. 7B. Based on these layouts, although the resistances of the first pull-up resistance unit 116 of FIG. 3 and the pull-down resistance unit 122 of FIG. 4 are doubled to obtain the on-die termination unit M240 of an effective resistance of 240Ω, the layout area of the on-die termination unit M240 of an effective resistance of 240Ω is smaller than that of the on-die termination unit M120 of an effective resistance of 120Ω.

Referring back to FIG. 7A, the number of on-die termination units M240 each having an effective resistance of 240Ω is twice the number of on-die termination units M120 each having an effective resistance of 120Ω. In other words, 14 on-die termination units M240 each having an effective resistance of 240Ω are connected to the data input/output pad DQ0. The read-out control signals DOP and DON are generated from an internal circuit (not shown) of the semiconductor device 100, and the ODT control signal ODT_CTRL is obtained by combining an on-die termination signal ODT received from the outside of the semiconductor device 100, ODT control address signals, for example, signals A9, A6, and A2 set in a mode register (MRS), and an ODT current reduction signal set according to a user's intention. The ODT current reduction signal may be set in the mode register MRS, like the ODT control address signals, or set according to a fuse cutting method.

In response to the read-out control signals DOP and DON and the ODT control signal ODT_CTRL, bits are enabled in the control unit 710, and the number of on-die termination units M240 turned on is determined according to the number of enabled bits. If only one bit is enabled in the control unit 710, one on-die termination unit M240 of an effective resistance of 240Ω is turned on. Accordingly, the termination resistance of the data input/output pad DQ0 is 240Ω. This shows that although the termination resistance has been calibrated to the effective resistance of 120Ω by ZQ calibration, the termination resistance is increased to 240Ω according to a user's intention to reduce the amount of current consumed during an operation of the semiconductor device 100.

If two bits are enabled in the control unit 710, two on-die termination units M240 each having the effective resistance of 240Ω are turned on. Accordingly, the termination resistance of the data input/output pad DQ0 is 120Ω. This shows that the termination resistance is maintained to be 120Ω regardless of a PVT variation, according to a result of ZQ calibration of the termination resistance to the effective resistance of 120Ω in accordance with an object of the ZQ calibration.

When the termination resistance is set differently depending on the type of system to which the semiconductor device 100 is applied, if 4 bits are enabled in the control unit 710, the termination resistance of the data input/output pad DQ0 is 60Ω. If 6 bits are enabled in the control unit 710, the termination resistance of the data input/output pad DQ0 is 40Ω. If 8 bits are enabled in the control unit 710, the termination resistance of the data input/output pad DQ0 is 30Ω. If 12 bits are enabled in the control unit 710, the termination resistance of the data input/output pad DQ0 is 20Ω. Although the data input/output pad DQ0 is described in the present embodiment, the description about the data input/output pad DQ0 is equally applicable to the other data input/output pads. Thus, the termination resistance of the data input/output pads DQ0-DQN may be 240Ω, 120Ω, 60Ω, 40Ω, 30Ω, or 20Ω.

Figure 8:
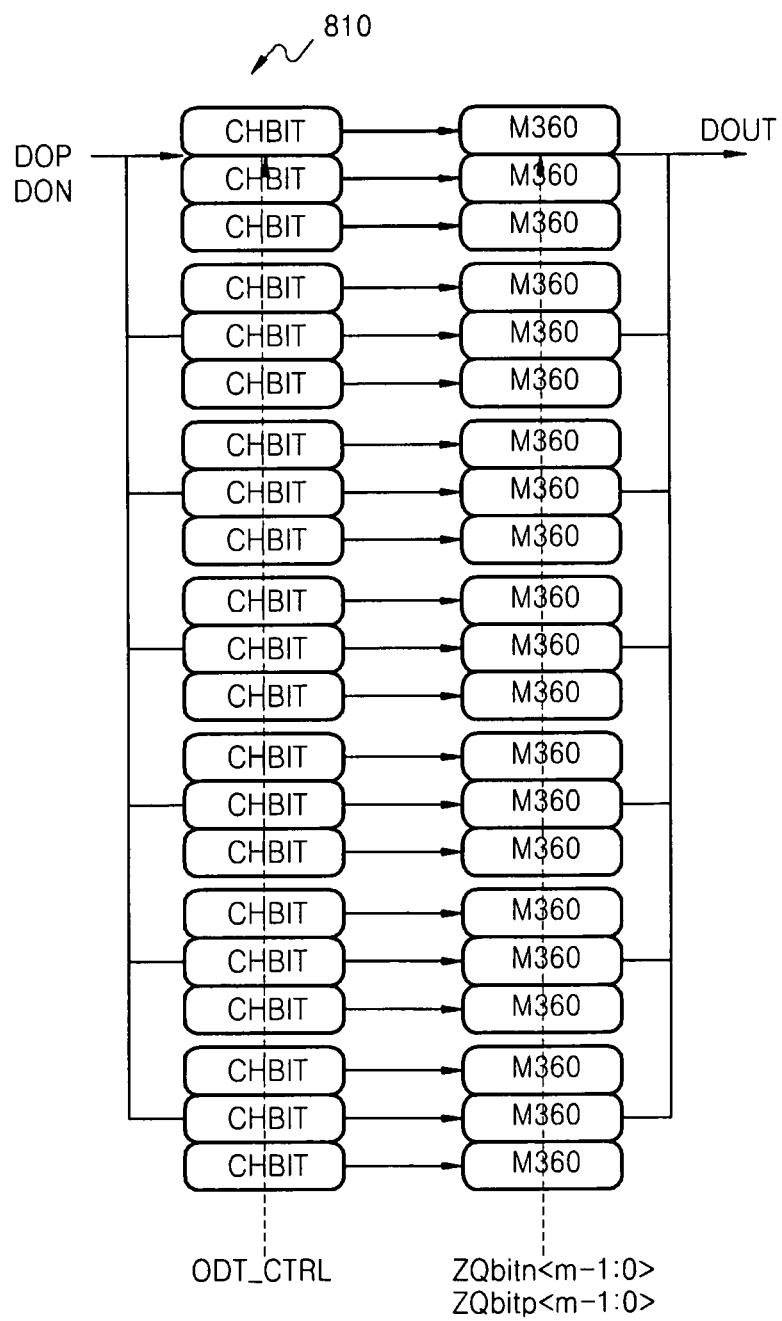
FIG. 8 illustrates a data input/output pad having an ODT structure, according to another example embodiment of inventive concepts.

FIG. 8 illustrates an output driver having an ODT structure, according to another example embodiment of inventive concepts.

Referring to FIG. 8, a plurality of on-die termination units M360 each having an effective resistance of 360Ω are connected to the data input/output pad DQ0, and a control unit 810 for determining whether to use each of the on-die termination units M360 in response to the read-out control signals DOP and DON and the ODT control signal ODT_CTRL is connected to the on-die termination units M360. As illustrated in FIG. 8, each on-die termination unit M360 may have an effective resistance of 360Ω. Each of the on-die termination units M360 having an effective resistance of 360Ω may be implemented by decreasing the widths of the transistors 300-303 of the first pull-up resistance unit 116 of FIG. 3 and the widths of the transistors 400-403 of the pull-down resistance unit 122 of FIG. 4 to one third and increasing the resistances of the resistors R0-R3 of the first pull-up resistance unit 116 of FIG. 3 and the pull-down resistance unit 122 of FIG. 4 by three times. The number of on-die termination units M360 each having an effective resistance of 360Ω is three times more than the number of on-die termination units M120 each having an effective resistance of 120Ω of FIG. 6. In other words, 21 on-die termination units M360 each having an effective resistance of 360Ω are connected to the data input/output pad DQ0.

In response to the read-out control signals DOP and DON and the ODT control signal ODT_CTRL, bits are enabled in the control unit 810, and the number of on-die termination units M360 turned on is determined according to the number of enabled bits. If only one bit is enabled in the control unit 810, one on-die termination unit M360 of an effective resistance of 360Ω is turned on. Accordingly, the termination resistance of the data input/output pad DQ0 is 360Ω. If two bits are enabled in the control unit 810, two on-die termination units M360 each having an effective resistance of 360Ω are turned on. Accordingly, the termination resistance of the data input/output pad DQ0 is 180Ω. These cases show that although the termination resistance has been calibrated to the effective resistance of 120Ω by ZQ calibration, the termination resistance is increased to 360Ω or 180Ω according to a user's intention to reduce the amount of current consumed during an operation of the semiconductor device 100.

If three bits are enabled in the control unit 810, three on-die termination units M360 each having an effective resistance of 360Ω are turned on. Accordingly, the termination resistance of the data input/output pad DQ0 is 120Ω. This shows that the termination resistance is maintained to be 120Ω regardless of a PVT variation, according to a result of ZQ calibration of the termination resistance to the effective resistance of 120Ω in accordance with an object of the ZQ calibration. When the termination resistance is set differently depending on the type of system to which the semiconductor device 100 is applied, if 6 bits are enabled in the control unit 810, the termination resistance of the data input/output pad DQ0 is 60Ω. If 9 bits are enabled in the control unit 810, the termination resistance of the data input/output pad DQ0 is 40Ω. If 12 bits are enabled in the control unit 810, the termination resistance of the data input/output pad DQ0 is 30 g. If 18 bits are enabled in the control unit 810, the termination resistance of the data input/output pad DQ0 is 20Ω.

Although the data input/output pad DQ0 is described in the present embodiment, the description about the data input/output pad DQ0 is equally applicable to the other data input/output pads. Thus, the termination resistance of the data input/output pads DQ0-DQN may be 360Ω, 180Ω, 120Ω, 60Ω, 40Ω, 30Ω, or 20Ω.

Figure 9A:
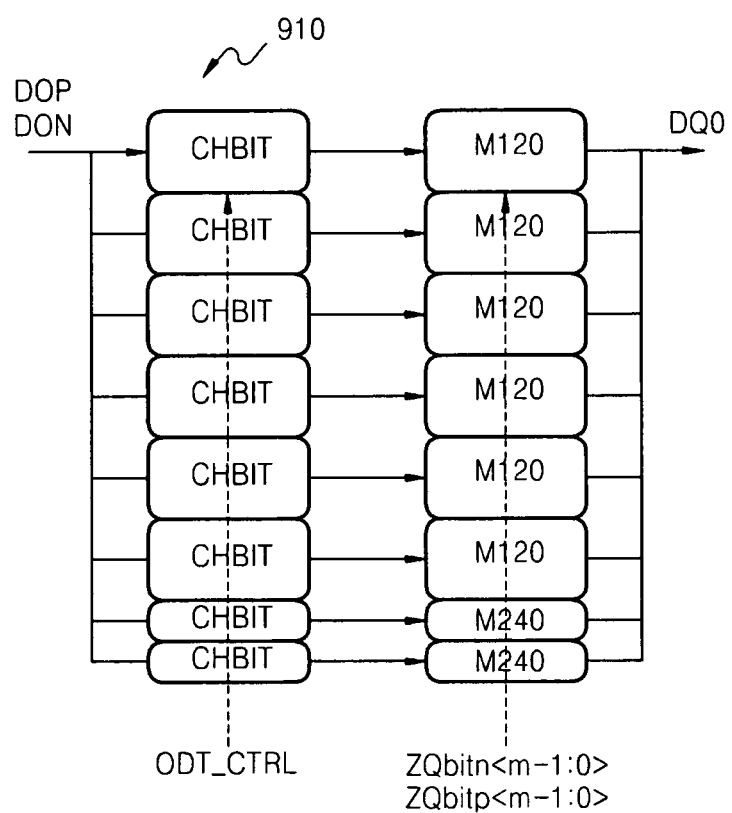
FIG. 9A illustrates a data input/output pad having an ODT structure, according to another example embodiment of inventive concepts.

FIG. 9A illustrates an output driver having an ODT structure, according to another example embodiment of inventive concepts. Referring to FIG. 9A, a plurality of on-die termination units M120 each having an effective resistance of 120Ω and at least two on-die termination units M240 each having an effective resistance of 240Ω are connected to the data input/output pad DQ0, and a control unit 910 for determining whether to use each of the on-die termination units M120 and M240 in response to the read-out control signals DOP and DON and the ODT control signal ODT_CTRL is connected to the on-die termination units M120 and M240.

In response to the read-out control signals DOP and DON and the ODT control signal ODT_CTRL, if one on-die termination unit M240 of an effective resistance of 240Ω is turned on in the control unit 910, the termination-resistance of the data input/output pad DQ0 is 240Ω. If the two on-die termination units M240 each having an effective resistance of 240Ω are turned on or one on-die termination units M120 of an effective resistance of 120Ω is turned in the control unit 910, the termination resistance of the data input/output pad DQ0 is 120Ω. If the two on-die termination units M120 each having an effective resistance of 120Ω are turned on, the termination resistance of the data input/output pad DQ0 is 60Ω. If three on-die termination units M120 each having an effective resistance of 120Ω are turned on, the termination resistance of the data input/output pad DQ0 is 40Ω. If four on-die termination units M120 each having an effective resistance of 120Ω are turned on, the termination resistance of the data input/output pad DQ0 is 30Ω. If six on-die termination units M120 each having an effective resistance of 120Ω are turned on, the termination resistance of the data input/output pad DQ0 is 20Ω.

Although the data input/output pad DQ0 is described in the present example embodiment, the description about the data input/output pad DQ0 is equally applicable to the other data input/output pads. Thus, the termination resistance of the data input/output pads DQ0-DQN may be 240Ω, 120Ω, 60Ω, 40Ω, 30Ω, or 20Ω. Compared with the embodiment of FIG. 7A, in the present embodiment, the layout area of the semiconductor device 100 may be reduced by decreasing the number of on-die termination units M240 each having an effective resistance of 240Ω and occupying a larger area than each of the on-die termination units M120 of an effective resistance of 120Ω.

FIG. 9A illustrates an example in which the plurality of on-die termination units M120 each having an effective resistance of 120Ω and the at least two on-die termination units M240 each having an effective resistance of 240Ω are connected to the data input/output pad DQ0. Each of the two on-die termination units M240 having an effective resistance of 240Ω may be implemented by doubling the resistances of the first pull-up resistance unit 116 of FIG. 3 and the pull-down resistance unit 122 of FIG. 4 as illustrated in FIGS. 7C through 7E. In FIG. 9A, on-die termination units each having a larger effective resistance than the effective resistance of 120Ω of each of the on-die termination units M120 may be used instead of the at least two on-die termination units M240 each having an effective resistance of 240Ω.

Figure 9B:
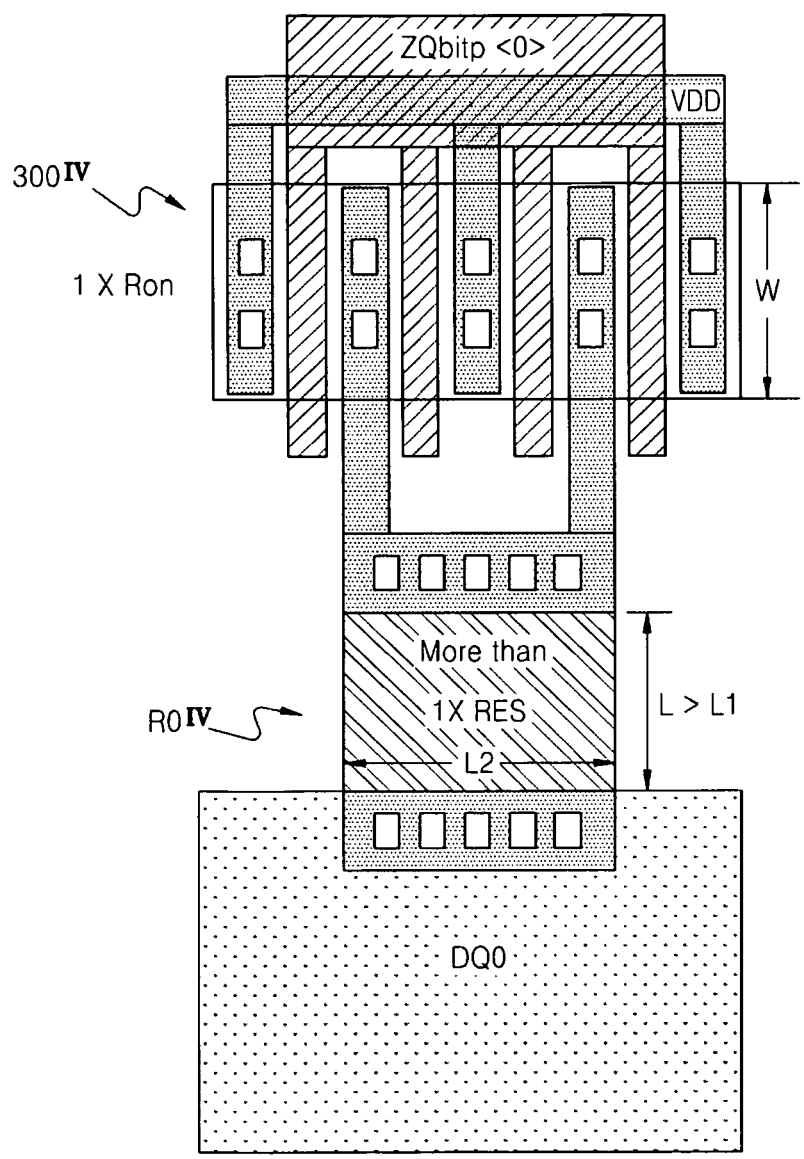
FIGS. 9B through 9D illustrate examples of changing resistances of a PMOS transistor and a resistor of the pull-up resistance unit of FIG. 3.
Figure 9C:
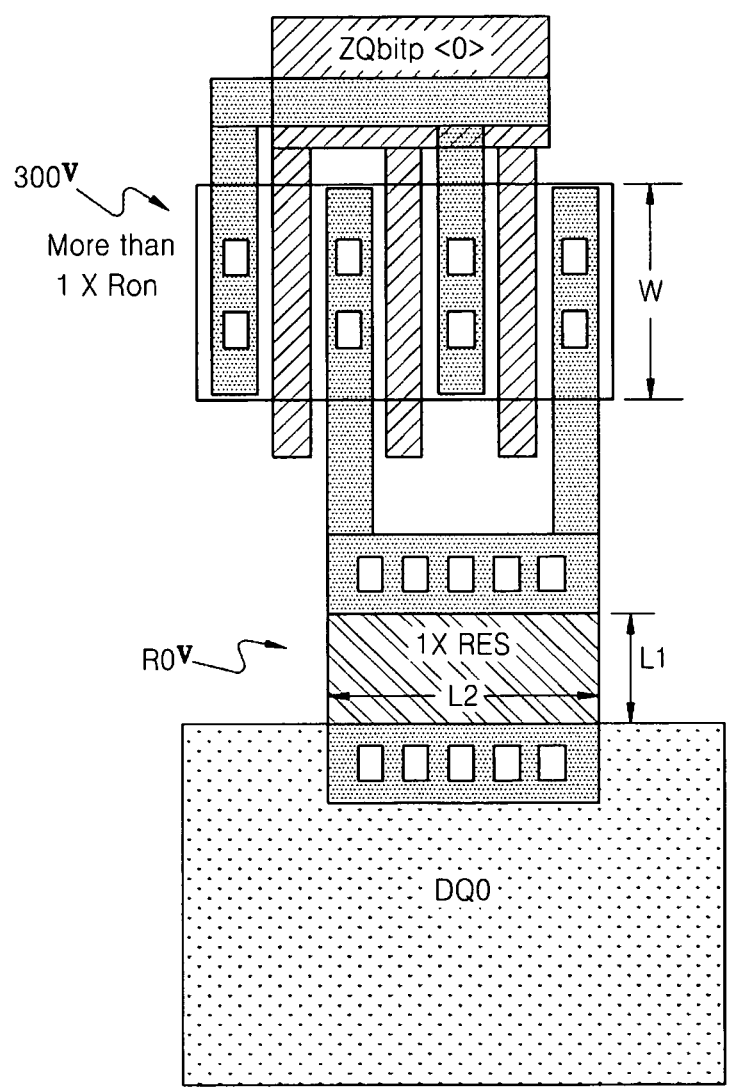
Figure 9D:
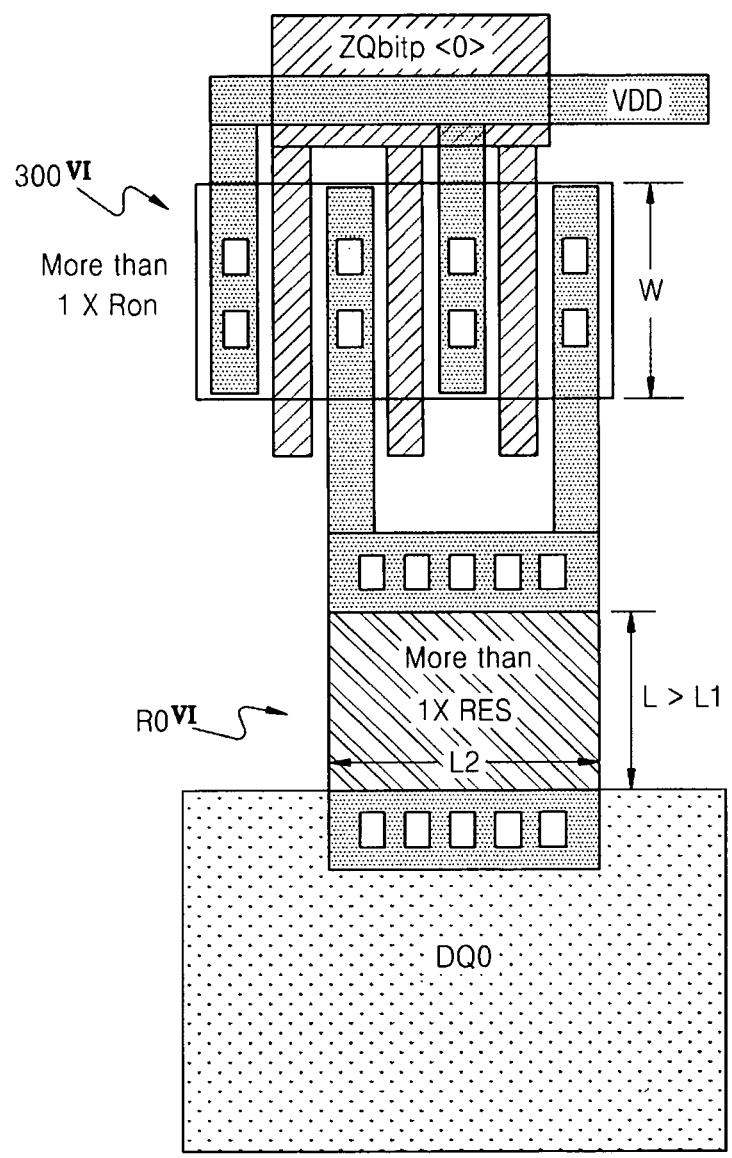

Each of the on-die termination units having larger effective resistances than the effective resistance of 120Ω, of each of the on-die termination units M120 may be implemented to have resistances greater than the resistances of the first pull-up resistance unit 116 of FIG. 3 and the pull-down resistance unit 122 of FIG. 4. FIGS. 9B through 9D illustrate examples of changing the resistances of a first PMOS transistor $300^{IV}$ and a first resistor $R0^{IV}$ from among the PMOS transistors 300-303 and the resistors R0-R3 of FIG. 3. The layouts of FIGS. 9B through 9D will now be described with respect to the layout of FIG. 7B.

Compared with FIG. 7B, FIG. 9B illustrates a layout in which a first PMOS transistor $300^{IV}$ connected to the first pull-up calibration code ZQbitp<0> includes the same number of gate fingers, namely, 4 gate fingers, each having the same width W to have the same on-resistance, namely, 1×Ron, and a first resistor $R0^{IV}$ has an increased length L greater than the length L1 to have an increased resistance. Compared with FIG. 7B, FIG. 9C illustrates a layout in which a first PMOS transistor $300^V$ connected to the first pull-up calibration code ZQbitp<0> includes gate fingers, the number of which is decreased by one, each having the same width W to have an increased on-resistance, and a first resistor $R0^V$ has the same length L1 and the same width L2. Compared with FIG. 7B, FIG. 9D illustrates a layout in which a first PMOS transistor $300^{VI}$ connected to the first pull-up calibration code ZQbitp<0> includes gate fingers, the number of which is decreased by one, each having the same width W to have an increased on-resistance, and a first resistor $R0^{VI}$ has an increased length L greater than the length L1 to have an increased resistance. Alternatively, in FIGS. 9B through 9D, the on-resistance Ron may be increased by increasing the thickness of a gate. As illustrated FIGS. 9B through 9D, the layouts allowing the first PMOS transistors $300^{IV}$-$300^{VI}$ and the first resistors $R0^{IV}$-$R^{VI}$ to have high resistances occupy a smaller area than the layout of FIG. 7B. Based on these layouts, although the on-die termination units each having a larger effective resistance than 120Ω may each be implemented to have higher resistances than the first pull-up resistance unit 116 of FIG. 3 and higher resistances than the pull-down resistance unit 122 of FIG. 4, the layout area of the on-die termination units each having a larger effective resistance than 120Ω is smaller than that of the on-die termination unit M120 each having an effective resistance of 120Ω.

Since the ODT structures of FIGS. 7A, 8, and 9A have been calibrated so that the resistance of the first pull-up resistance unit 116 of the ZQ calibration circuit 110 of FIG. 1 is equal to the resistance of 240Ω of the external resistor 10 of FIG. 1, the resistance of the ZQ pin 112 is 120Ω, which is half the resistance of the external resistor 10. The ZQ calibration circuit 110 provides the pull-up and pull-down calibration codes ZQbitp<m-1:0> and ZQbitn<m-1:0> that vary according to the PVT variation. To perform calibration sensitively with respect to the PVT variation, the ZQ calibration circuit 110 may be implemented with a structure in which two first pull-up resistance units 116 each having a resistance of 480Ω, which is twice the resistance of 240Ω of the external resistor 10, are connected to each other in parallel. Each first pull-up resistance unit 116 having a resistance of 480Ω may be implemented by halving the width of each of the transistors 300-303 of the first pull-up resistance unit 116 of FIG. 3 and doubling the resistance of the resistors R0-R3 thereof. Alternatively, the ZQ calibration circuit 110 may be implemented with a structure in which two second pull-up resistance units 118 each having a resistance of 480Ω are connected to each other in parallel and two pull-down resistance units 122 each having a resistance of 480Ω are connected to each other in parallel. Accordingly, the ZQ calibration circuit 110 may provide the pull-up and pull-down calibration codes ZQbitp<m-1:0> and ZQbitn<m-1:0> by controlling the current flowing in the first pull-up resistance unit 116, the second pull-up resistance unit 118, and the pull-down resistance unit 122 according to the PVT variation.

Figure 10A:
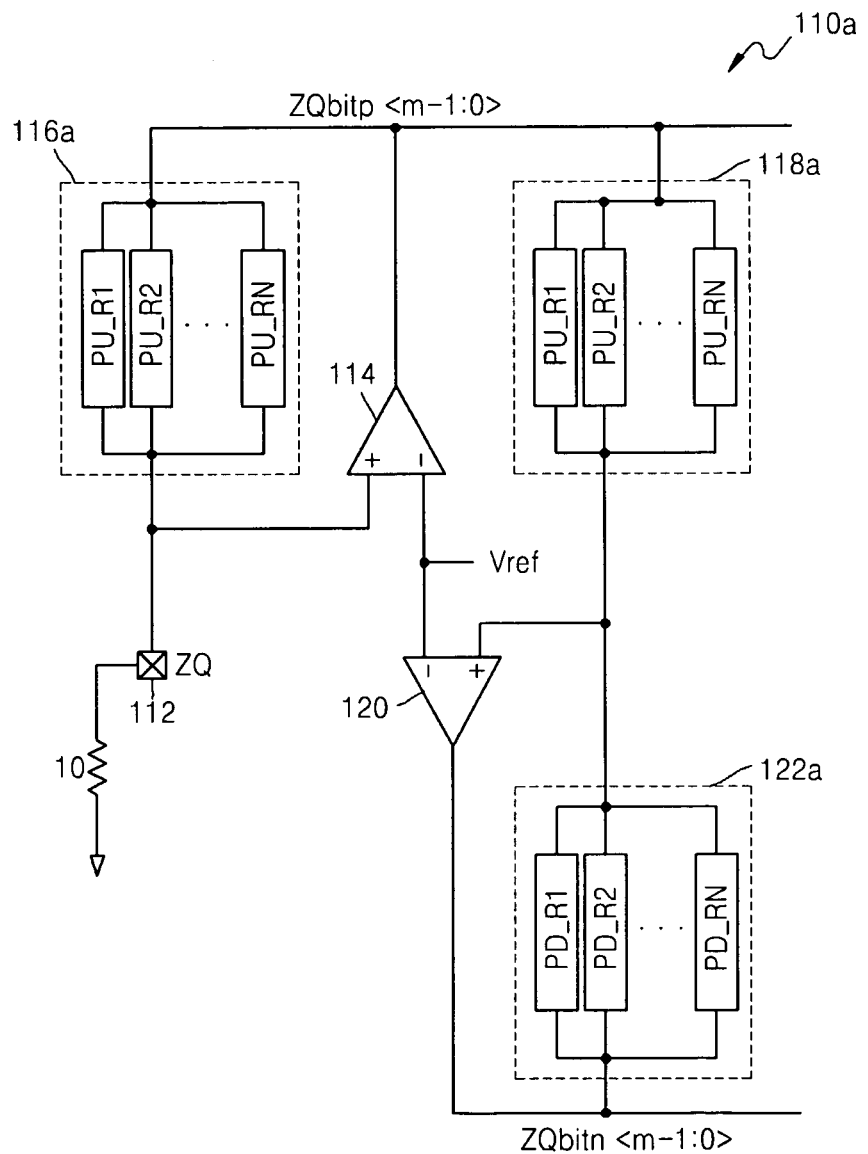
FIG. 10A illustrates a calibration circuit for performing calibration according to a Process-Voltage-Temperature (PVT) variation, according to example embodiments of inventive concepts.

FIG. 10A illustrates a ZQ calibration circuit 110a for performing calibration more sensitively according to a PVT variation, according to an example embodiment of inventive concepts. Referring to FIG. 10A, the ZQ calibration circuit 110a, as compared with the ZQ calibration circuit 110 of FIG. 1, includes a first pull-up resistance unit 116a and a second pull-up resistance unit 118a, in each of which N resistance units PU_R1 through PU_RN each having a resistance N times (where N denotes a natural number equal to or greater than 2) greater than the resistance of 240Ω of the external resistor 10 are connected to each other in parallel, and a pull-down resistance unit 122a in which N resistance units PD_R1 through PD_RN each having a resistance N times greater than the resistance of 240Ω of the external resistor 10 are connected to each other in parallel (where N denotes a natural number equal to or greater than 2).

The ZQ calibration circuit 110a may be implemented variously so that the resistances of the first pull-up resistance unit 116a, the second pull-up resistance unit 118a, and the pull-down resistance unit 122a are greater than the resistance of the external resistor 10. FIGS. 10B through 10E illustrate transistors $300^X$-$300^{XIII}$, which are examples of changing the resistances of the PMOS transistors 300-303 and the resistors R0-R3 of the first pull-up resistance unit 116 or the second pull-up resistance unit 118 of FIG. 3.

Figure 10B:
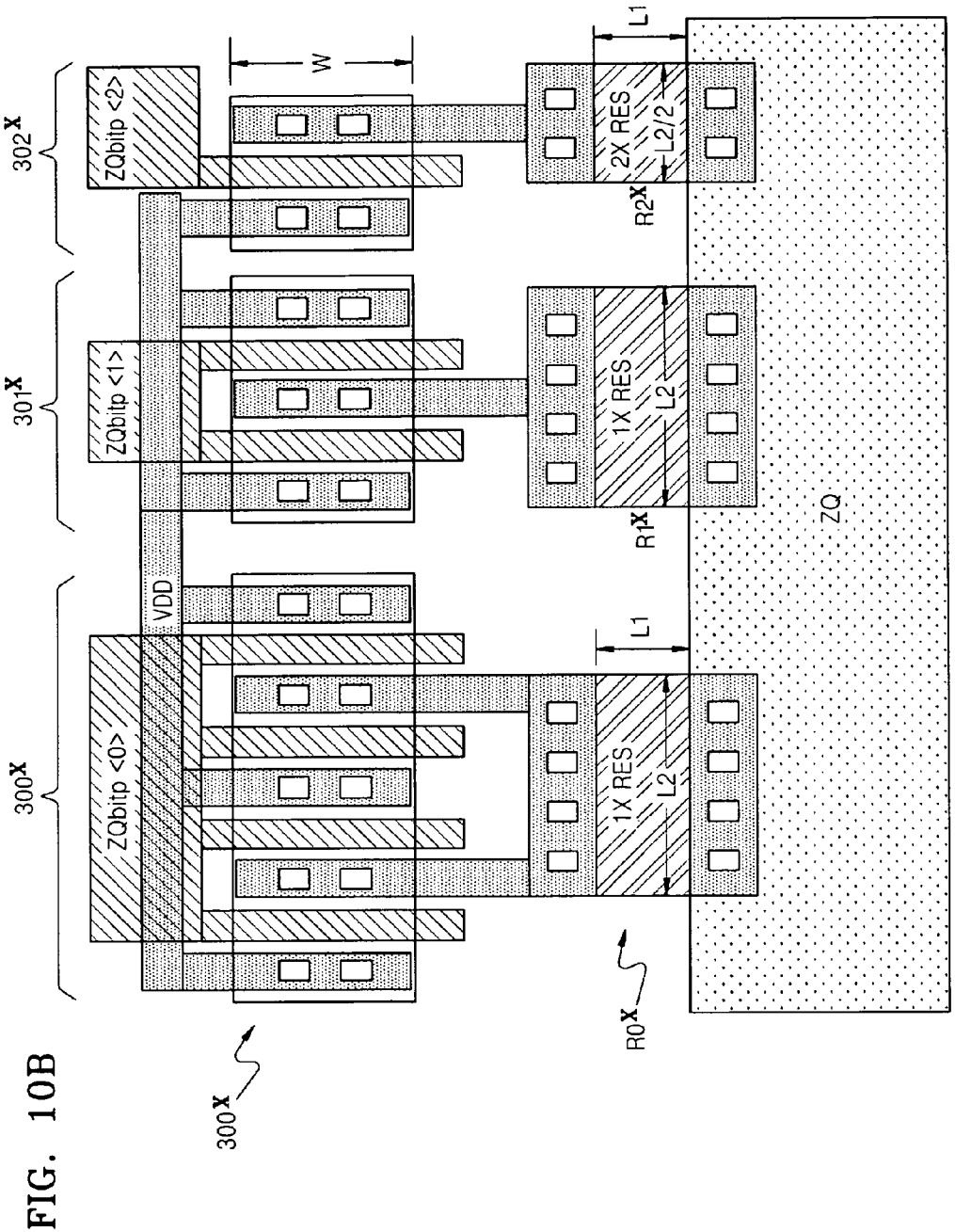
FIGS. 10B through 10E illustrate examples of changing resistances of a PMOS transistor and a resistor of a pull-up resistance unit.
Figure 10C:
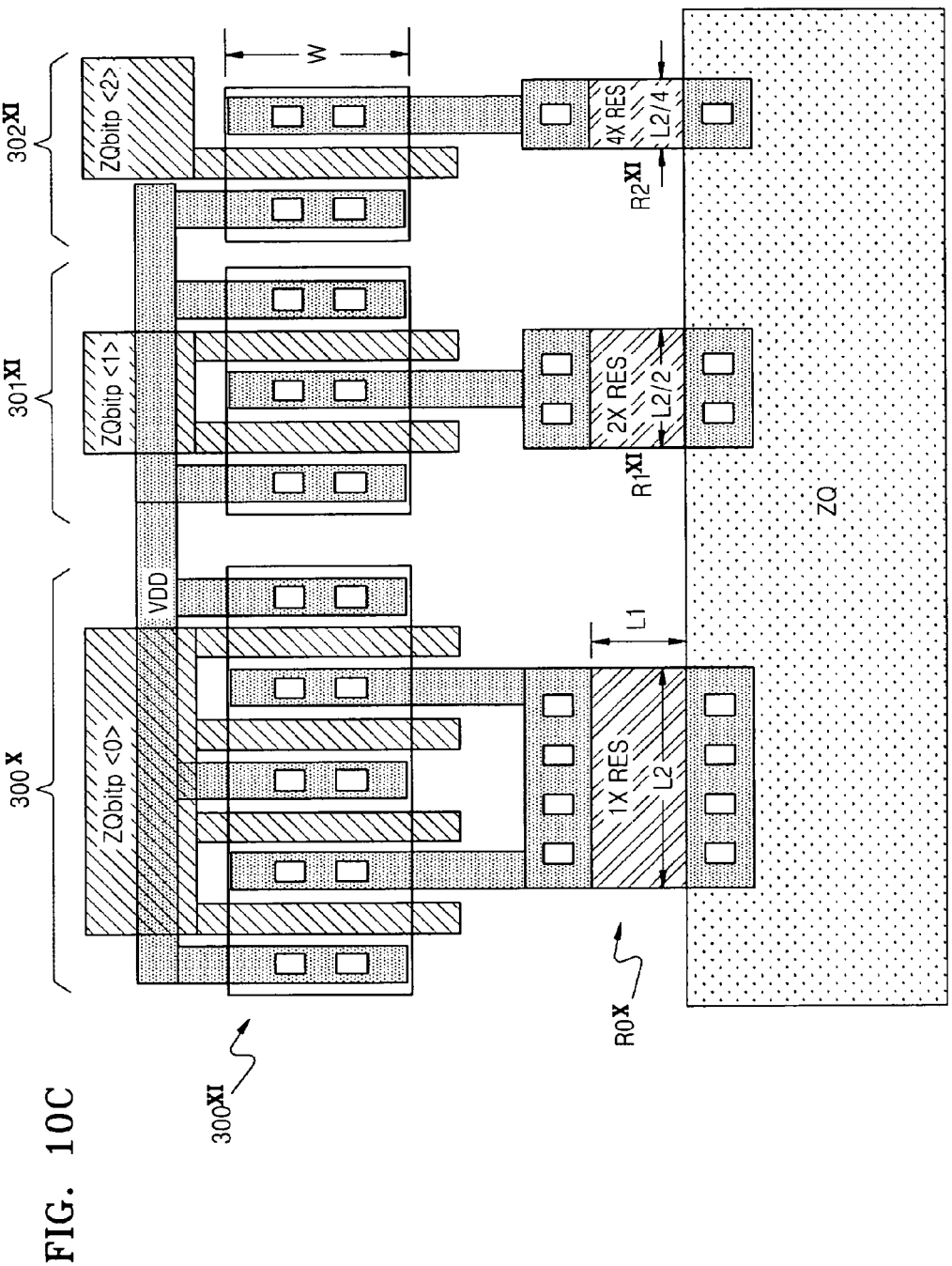
Figure 10D:
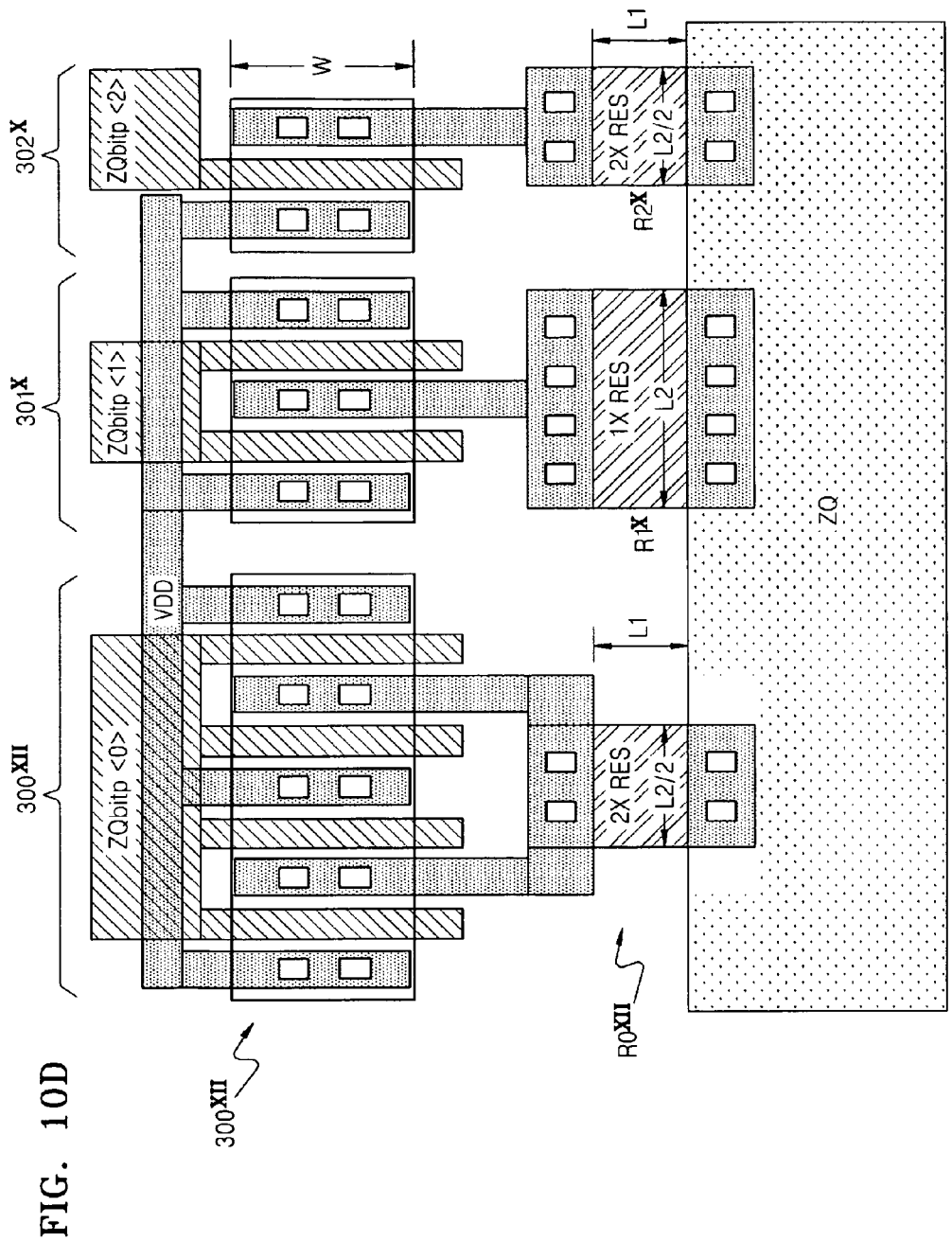
Figure 10E:
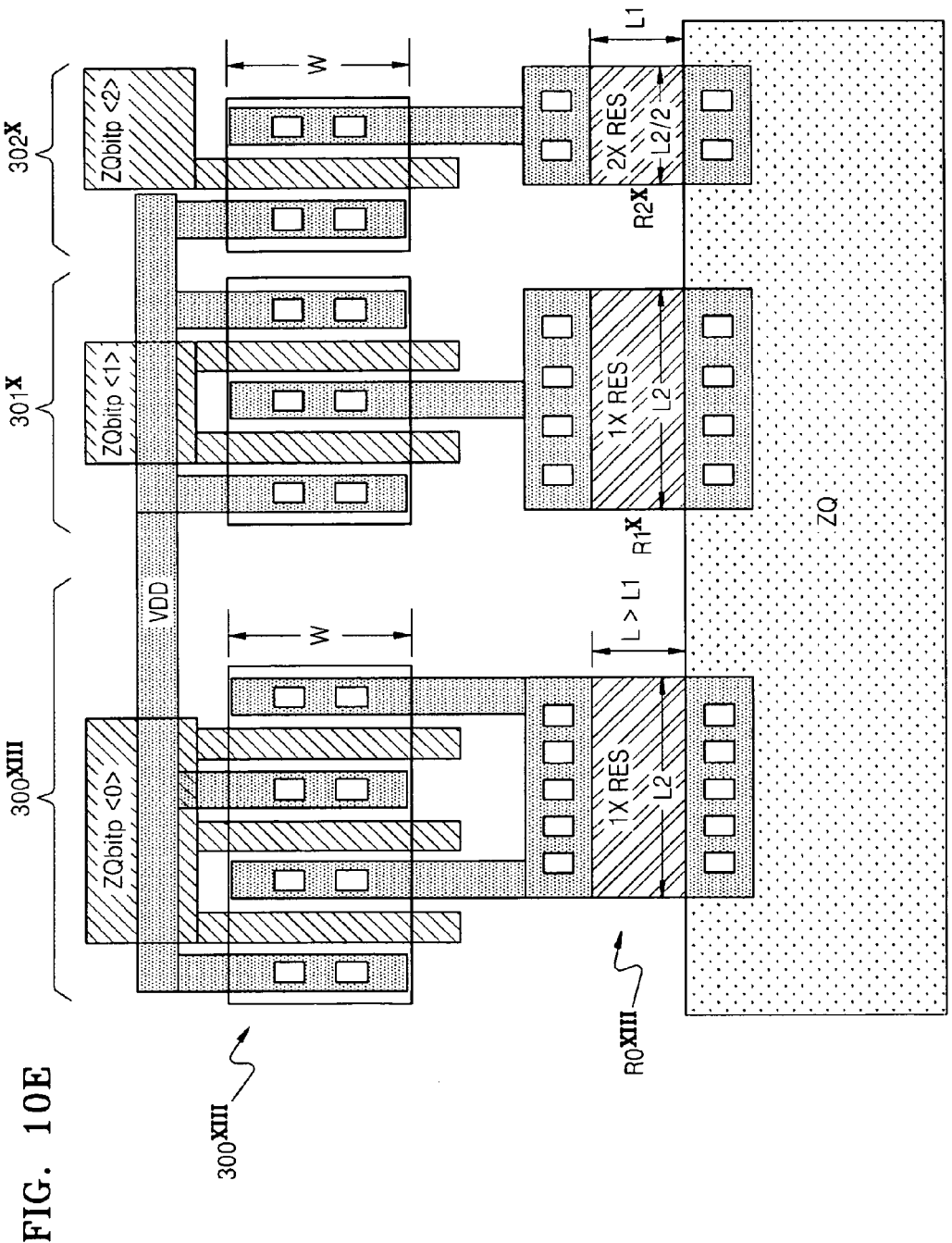

In the example of FIG. 10B, a first PMOS transistor $300^X$ connected to the first pull-up calibration code ZQbitp<0> includes four gate fingers each having the width W to have the on-resistance Ron, namely, 1×Ron, a first resistor $R0^X$ has the length L1 and the width L2 to have a resistance RES, namely, 1×RES, a second PMOS transistor $301^X$ connected to a second pull-up calibration code ZQbitp<1> includes two gate fingers each having the width W to have an on-resistance, namely, 2×Ron, a second resistor R1 has the length L1 and the width L2 to have the resistance RES, namely, 1×RES, a third PMOS transistor $302^X$ connected to a third pull-up calibration code ZQbitp<2> includes one gate finger having the width W to have an on-resistance, namely, 4×Ron, and a third resistor R2 has a width L2/2, which is half the width L2 of the first resistor $R0^X$, to have the resistance, namely, 2×RES. The example of FIG. 10C is the same as that of FIG. 10B except that a second resistor $R1^{XI}$ has a halved length L2/2 to have a resistance, namely, 2×RES, and a third resistor $R2^{XI}$ has a quartered length L2/4 to have a resistance, namely, 4×RES. The example of FIG. 10D is the same as that of FIG. 10B except that a first resistor $R0^{XII}$ has a halved length L2/2 to have a resistance, namely, 2×RES. The example of FIG. 10E is the same as that of FIG. 10B except that a first PMOS transistor $300^{XIII}$ includes 4 gate fingers each having the width W by reducing the number of gate fingers of the first PMOS transistor 300 by one, thereby having an increased on-resistance.

A first comparison unit 114 and a second comparison unit 120 in the ZQ calibration circuit 110a are the same as those illustrated in FIG. 2, and thus detailed description thereof will be omitted. The ZQ calibration circuit 110a may provide the pull-up and pull-down calibration codes ZQbitp<m-1:0> and ZQbitn<m-1:0> by controlling the current flowing in the first pull-up resistance unit 116a, the second pull-up resistance unit 118a, and the pull-down resistance unit 122a according to the PVT variation.

Figure 11:
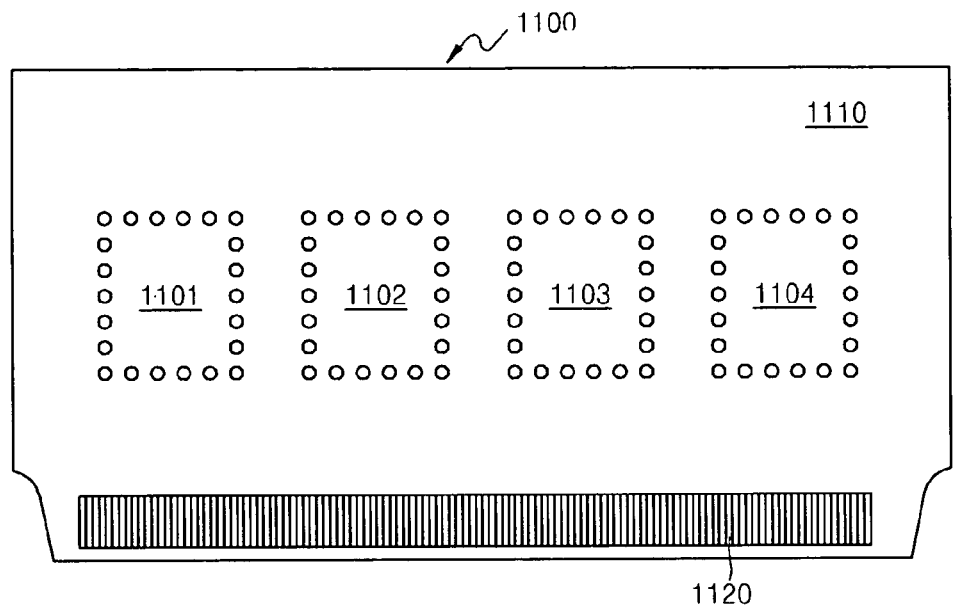
FIG. 11 illustrates a memory module using memory chips according to inventive concepts.
Figure 12:
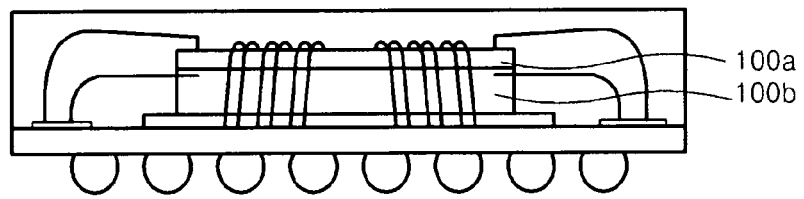
FIG. 12 illustrates a Dual Die Package (DDP) package of semiconductor devices having ODT structures according to inventive concepts.
Figure 13:
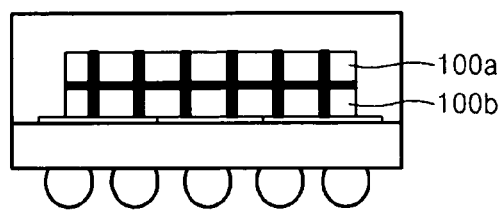
FIG. 13 illustrates a Through Silicon Via (TSV) package of semiconductor devices having ODT structures according to inventive concepts.

FIG. 11 illustrates a memory module 1100 using memory chips 1101 through 1104, each including a semiconductor device having an ODT structure according to inventive concepts. Each of the memory chips 1101 through 1104 includes the semiconductor device having an ODT structure illustrated in at least one of FIGS. 7A through 9D and the ZQ calibration circuit 110 or 110a illustrated in FIG. 1 and FIGS. 10A through 10E. The memory module 1100 is a Single in line memory module (SIMM) having the four memory chips 1101-1104 arranged on one surface of a Printed Circuit Board (PCB) 1110. The number of memory chips arranged in a SIMM may be at least one, meaning one or more. The PCB 1110 has an edge connector 1120 formed close to a lengthwise edge and allowing the PCB 1110 to be inserted into a memory socket on a computer motherboard. Although not shown in FIG. 11, a wiring pattern is formed on the PCB 1110, and terminals or leads that constitute the edge connector 1120 are connected to the memory chips 1101-1104 via the wiring pattern (not shown). In order to double the memory density, each of the memory chips 1101-1104 may have a structure in which two semiconductor devices 100*a* and 100*b* are stacked using a Dual Die Package (DDP) technique as shown in FIG. 12 or a Through Silicon Via (TSV) packaging technique as shown in FIG. 13. Although two semiconductor devices 100*a* and 100*b* are stacked, inventive concepts are not limited thereto, and a plurality of semiconductor devices may be stacked.

Figure 14:
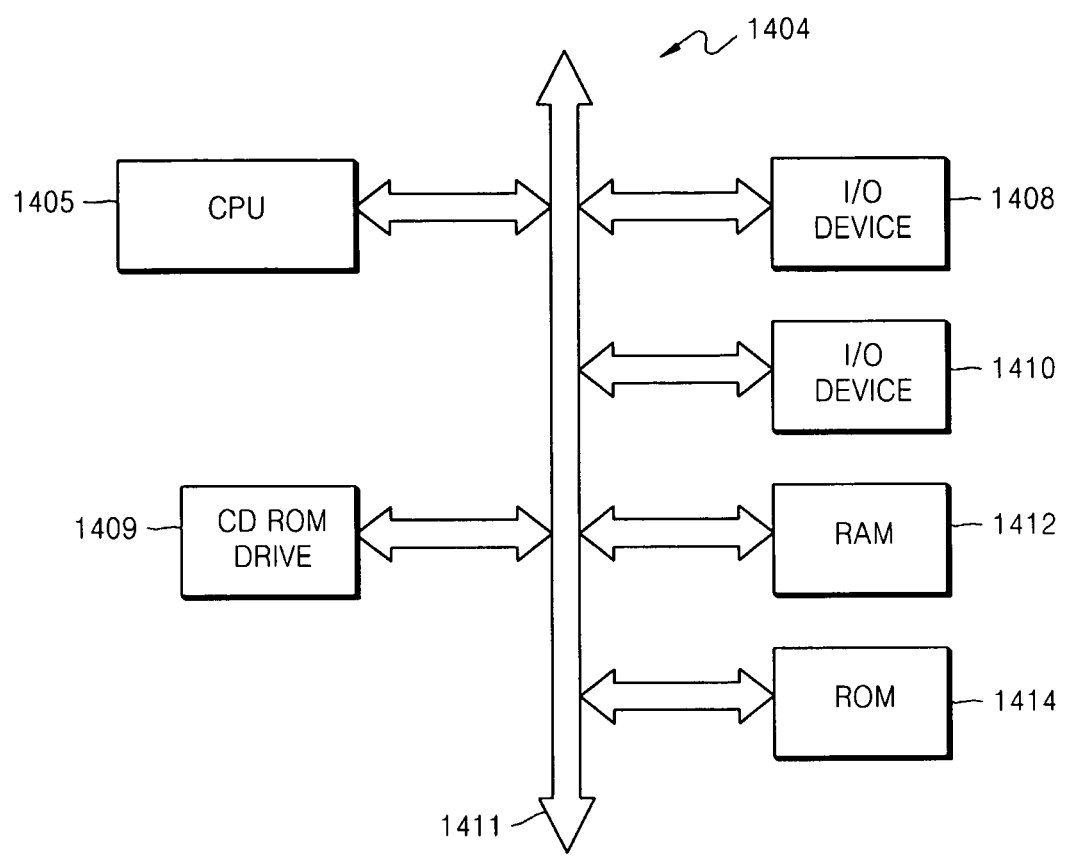
FIG. 14 is a block diagram of a processor-based system using a random access memory (RAM) implemented as a semiconductor device having an ODT structure according to inventive concepts.

FIG. 14 is a block diagram of a system 1404 that is based on a processor and uses a random access memory (RAM) 1412 implemented as the semiconductor device having an ODT structure according to inventive concepts. In other words, the RAM 1412 uses an ODT structure illustrated in at least one of FIGS. 7A through 9D and the ZQ calibration circuit 100 or 110*a* illustrated in FIGS. 10A through 10E. The system 1404 may be a computer system, a processor control system, or any other system using memory associated with a processor. The system 1404 includes a CPU 1405 such as a microprocessor that communicates with the RAM 1412 and input/output (I/O) devices 1408 and 1410 via a bus 1411. The system 1404 includes a read only memory (ROM) 1414 and peripherals such as a CD ROM driver 1409 that communicates with the CPU 1405 via the bus 1411.

Although a semiconductor device having an ODT structure according to inventive concepts are implemented into the RAM 1412, the semiconductor device may be implemented into any of various memory devices such as SDRAM, DDR SDRAM, RDRAM, VRAM, SRAM, flash memory, EPROM, EEPROM, or PRAM. While inventive concepts have been particularly shown and described with reference to example embodiments thereof, it will be understood that various changes in form and details may be made therein without departing from the spirit and scope of the following claims.

What is claimed is:

1. A semiconductor device comprising:
   a calibration circuit configured to generate calibration codes in response to a reference voltage and a voltage of a calibration terminal connected to an external resistor; and
   an on-die termination device configured to control a termination resistance of a data input/output pad in response to the calibration codes and an on-die termination control signal,
   wherein the termination resistance of the data input/output pad is greater than a resistance of the calibration terminal.

2. The semiconductor device of claim 1, wherein the on-die termination device is configured to control termination resistance of the data input/output pad based on a number of gate fingers included in a transistor of the on-die termination device.

3. The semiconductor device of claim 1, wherein the on-die termination device is configured to control the termination resistance of the data input/output pad based on the resistance of the on-die termination device.

4. The semiconductor device of claim 1, wherein the on-die termination device comprises:
   a plurality of the on-die termination units connected to the data input/output pad and having a resistance corresponding to N times a resistance of the external resistor, wherein N denotes a natural number equal to or greater than 1; and
   a control unit configured to activate a number of on-die termination units in response to the on-die termination control signal.

5. The semiconductor device of claim 4, wherein at least one of the plurality of the on-die termination units comprises:
   a pull-up resistance unit configured to have a resistance corresponding to twice the resistance of the external resistor in response to a pull-up calibration code; and
   a pull-down resistance unit configured to have a resistance corresponding to twice the resistance of the external resistor in response to a pull-down calibration code.

6. The semiconductor device of claim 1, wherein the on-die termination device comprises:
   at least N first on-die termination units connected to the data input/output pad and having a resistance corresponding to N times a resistance of the external resistor, wherein N denotes a natural number equal to or greater than 1;
   a plurality of second on-die termination units connected to the data input/output pad and having a resistance corresponding to half the resistance of the external resistor; and
   a control unit configured to activate a number of first and second on-die termination units in response to the on-die termination control signal.

7. The semiconductor device of claim 6, wherein at least one of the first on-die termination units comprises:
   a pull-up resistance unit configured to have a resistance corresponding to 2N times the resistance of the external resistor in response to a pull-up calibration code; and
   a pull-down resistance unit configured to have a resistance corresponding to 2N times the resistance of the external resistor in response to a pull-down calibration code.

8. The semiconductor device of claim 6, wherein at least one of the second on-die termination unit comprises:
   a pull-up resistance unit configured to have the resistance of the external resistor in response to a pull-up calibration code; and
   a pull-down resistance unit configured to have the resistance of the external resistor in response to a pull-down calibration code.

9. The semiconductor device of claim 1, wherein the calibration circuit comprises:
   a first comparison unit configured to compare the voltage of the calibration terminal with the reference voltage and output a pull-up calibration code of the calibration codes based on the comparison of the voltage of the calibration terminal with the reference voltage;
   a first pull-up resistance unit connected to the calibration terminal and configured to control a resistance of the first pull-up resistance unit to be equal to a resistance of the external resistor in response to the pull-up calibration code;
   a second pull-up resistance unit connected to a first node and configured to control a resistance of the second pull-up resistance unit to be equal to the resistance of the first pull-up resistance unit in response to the pull-up calibration code;
   a second comparison unit configured to compare a voltage of a first node with the reference voltage and output a pull-down calibration code of the calibration codes based on the comparison of the voltage of the first node with the reference voltage; and
   a pull-down resistance unit connected to the first node and configured to control a resistance of the pull-down resistance unit to be equal to the resistance of the second pull-up resistance unit in response to the pull-down calibration code.

10. The semiconductor device of claim 9, wherein each of the first and second pull-up resistance units and the pull-down resistance unit has N resistors, each of the N resistors having a resistance N times greater than the resistance of the external resistor and connected to each other in parallel.

11. The semiconductor device of claim 1, wherein the semiconductor device is a memory device.

12. The semiconductor device of claim 11, wherein the memory device is one selected from a group including RAM, SDRAM, DDR SDRAM, RDRAM, VRAM, SRAM, flash memory, EPROM, EEPROM, and PRAM.

13. A memory module comprising:
a printed circuit board; and
at least one memory chip mounted on the printed circuit board and comprising at least two stacked semiconductor devices,
wherein each of the at least two stacked semiconductor devices includes,
a calibration circuit configured to generate pull-up calibration codes and pull-down calibration codes in response to a reference voltage and a voltage of a calibration terminal, and
an on-die termination device for controlling a termination resistance of a data input/output pad in response to the pull-up calibration codes, the pull-down calibration codes, and an on-die termination control signal, the termination resistance of the data input/output pad being greater than a resistance of the calibration terminal.

14. A system comprising:
a semiconductor device; and
a controller configured to control the semiconductor device via a bus,
wherein the semiconductor device includes,
a calibration circuit configured to generate a pull-up calibration code and a pull-down calibration code in response to a reference voltage and a voltage of a calibration terminal, and
an on-die termination device configured to control a termination resistance of a data input/output pad in response to the pull-up calibration code, the pull-down calibration code, and an on-die termination control signal, the termination resistance of the data input/output pad being greater than a resistance of the calibration terminal.

15. A termination method performed in a semiconductor device, comprising:
first adjusting a first termination resistance in response to a pull-up calibration code and a pull-down calibration code; and
second adjusting a second termination resistance in response to the pull-up and pull-down calibration codes and an on-die termination control signal,
wherein the second termination resistance is greater than the first termination resistance.

16. The termination method of claim 15, wherein the second adjusting adjusts the second termination resistance to be N times a resistance of an external resistor connected to a calibration terminal, wherein N denotes a natural number equal to or greater than 2.

17. The termination method of claim 15, wherein the termination method further comprises:
first comparing a voltage of the calibration terminal with a reference voltage to output the pull-up calibration code;
first controlling a resistance of a first pull-up resistance unit connected to the calibration terminal to be equal to a resistance of an external resistor connected to the calibration terminal in response to the pull-up calibration code;
second controlling a resistance of a second pull-up resistance unit connected to a first node to be equal to the resistance of the first pull-up resistance unit in response to the pull-up calibration code;
second comparing a voltage of the first node with the reference voltage to output the pull-down calibration code; and
third controlling a resistance of a pull-down resistance unit connected to the first node to be equal to the resistance of the second pull-up resistance unit in response to the pull-down calibration code.

18. The termination method of claim 17, wherein each the first and second pull-up resistance units and the pull-down resistance unit includes N resistors each having a resistance N times greater than the resistance of the external resistor are connected to each other in parallel.

* * * * *